(12) United States Patent
Kai et al.

(10) Patent No.: US 8,288,812 B2
(45) Date of Patent: Oct. 16, 2012

(54) SEMICONDUCTOR DEVICE AND METHOD OF MANUFACTURING THE SAME

(75) Inventors: Yasunobu Kai, Kanagawa-ken (JP); Takaki Hashimoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 150 days.

(21) Appl. No.: 12/871,271

(22) Filed: Aug. 30, 2010

(65) Prior Publication Data

US 2011/0049601 A1 Mar. 3, 2011

(30) Foreign Application Priority Data

Aug. 31, 2009 (JP) ................................. 2009-200440
Mar. 24, 2010 (JP) ................................. 2010-067574

(51) Int. Cl.
*H01L 29/788* (2006.01)

(52) U.S. Cl. . 257/314; 257/315; 257/390; 257/E27.103; 257/E29.304

(58) Field of Classification Search .................. 257/314, 257/315, 390, E27.103, E29.304
See application file for complete search history.

(56) References Cited

U.S. PATENT DOCUMENTS

| | | | |
|---|---|---|---|
| 6,150,059 A | 11/2000 | Tanabe et al. | |
| 2010/0202181 A1 | 8/2010 | Hashimoto et al. | |
| 2011/0065275 A1* | 3/2011 | Kim et al. | 438/666 |

FOREIGN PATENT DOCUMENTS

JP 7-202143 8/1995

OTHER PUBLICATIONS

Shibuya et al., Kaisetu to Ketsuzou no Kogaku (Optics of Diffraction and Image Formation), Optics Library Series 1, Asakura Shoten, Nov. 25, 2005, pp. 40-47.

* cited by examiner

*Primary Examiner* — Minh-Loan T Tran
(74) *Attorney, Agent, or Firm* — Finnegan, Henderson, Farabow, Garrett & Dunner, L.L.P.

(57) ABSTRACT

According to one embodiment, a semiconductor device includes a substrate, conductive members, an interlayer insulating film, and a plurality of contacts. The conductive members are provided in an upper portion of the substrate or above the substrate to extend in one direction. The interlayer insulating film is provided on the substrate and the conductive members. The plurality of contacts is provided in the interlayer insulating film. In a first region on the substrate, the contacts are located at some of lattice points of an imaginary first lattice. In a second region on the substrate, the contacts are located at some of lattice points of an imaginary second lattice. The second lattice is different from the first lattice. Each of the first lattice and the second lattice includes some of the lattice points located on the conductive members or on an extension region extended in the one direction of the conductive members. A position of each of the lattice points located on the conductive members and the extension region in the one direction is periodically displaced based on every n consecutively-arranged conductive members (n is a natural number).

15 Claims, 30 Drawing Sheets

VERTICAL
DIRECTION

→ SOURCE-LINE
DIRECTION

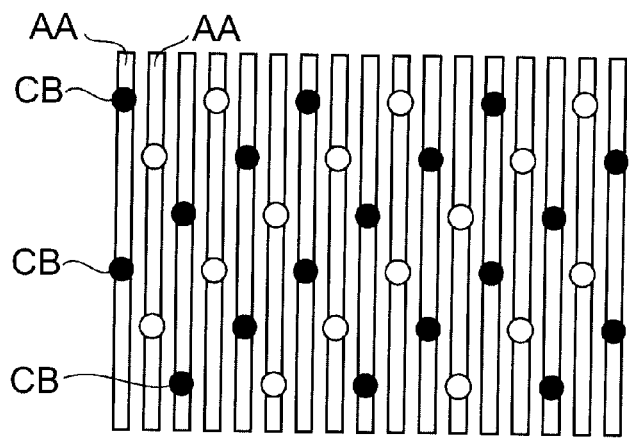
FIG. 11A
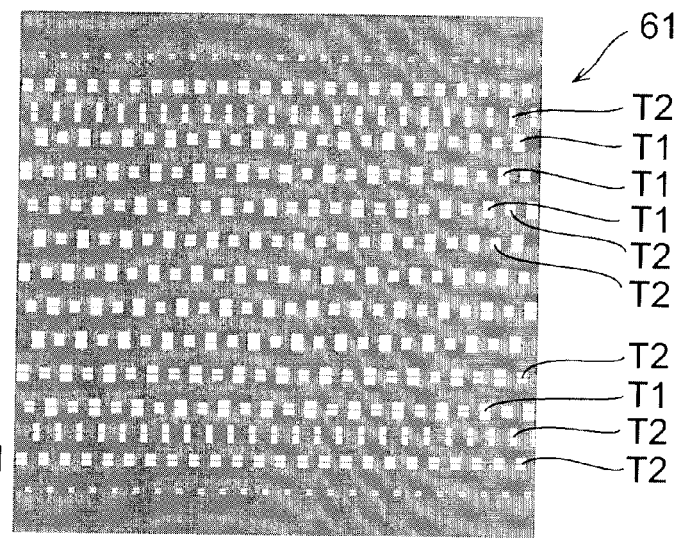
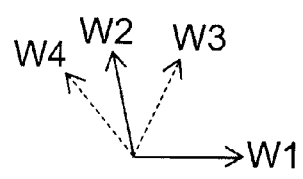
FIG. 11B
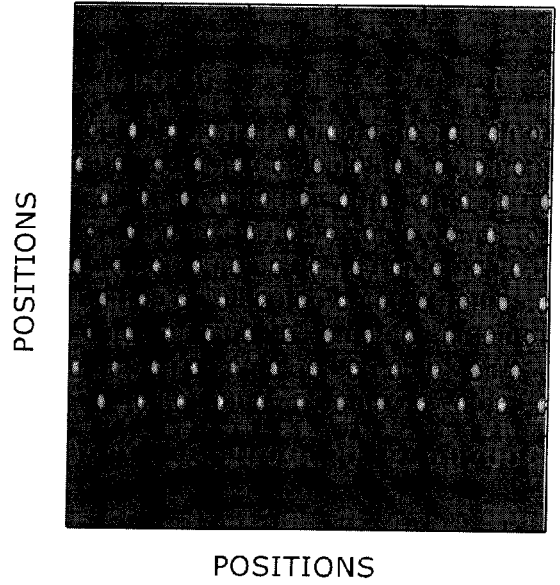
FIG. 11C n=3 n=4 n=5 n=3 n=4

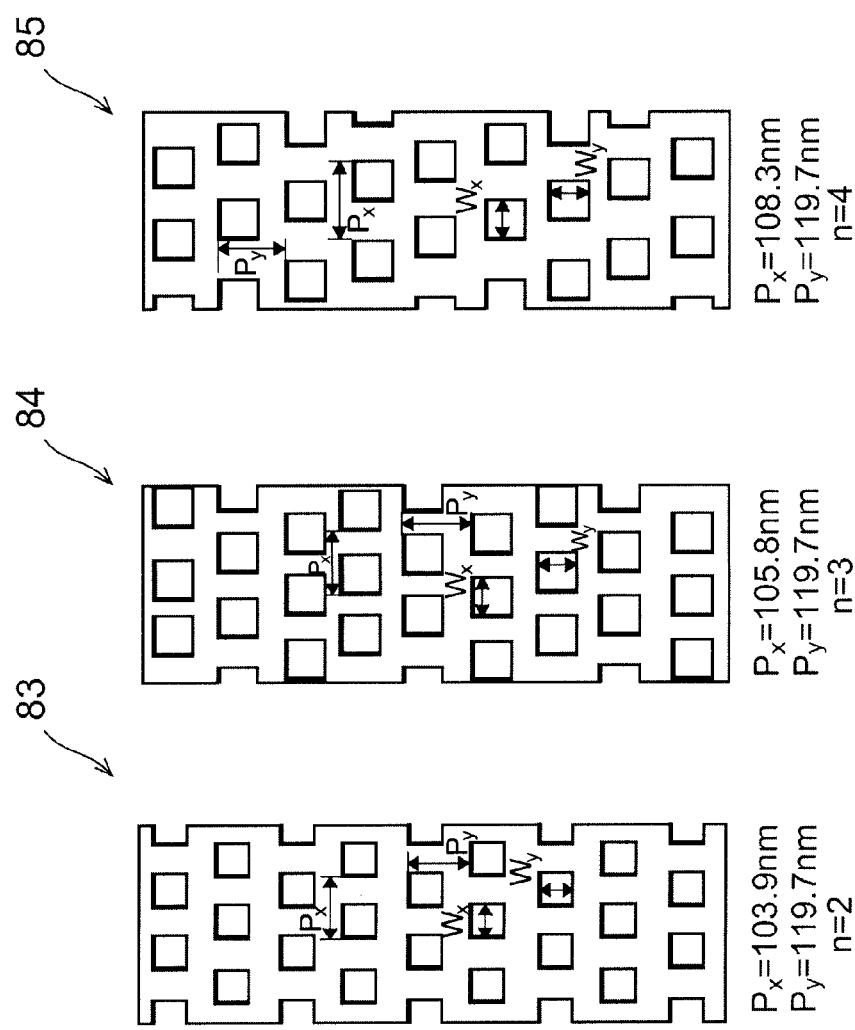
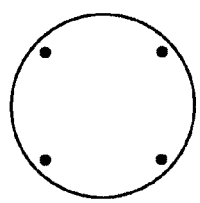

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2009-200440, filed on Aug. 31, 2009 and the prior Japanese Patent Application No. 2010-67574, filed on Mar. 24, 2010; the entire contents of which are incorporated herein by reference.

FIELD

Embodiments described herein relate generally to a semiconductor device and a method of manufacturing the same.

BACKGROUND

In recent years, with progress of miniaturization of semiconductor devices, the semiconductor devices have come to require finer processing than the current highest resolution level of the photolithography technique, and such finer processing has become more difficult. In this respect, sidewall processing and double exposure are used to form the wirings in such semiconductor devices. The sidewall processing, however, cannot be used in forming contact holes while the double-exposure method is not very preferable in view of the cost. Consequently, stable formation of contacts has become more difficult.

In NAND flash memories, for example, the upper portion of the silicon substrate is divided by STIs (Shallow Trench Isolations) into plural line-shaped active areas extended in one direction. Then, multiple memory transistors of MOS-FET (Metal-Oxide-Semiconductor Field-Effect Transistor) structure are formed along the active areas. The active areas are supplied with electric potentials via bit-line contacts from the bit lines formed in an upper layer (for instance, refer to JP-A Hei 7-202143 (Kokai)). In such NAND flash memories, the active areas are arranged at a smaller pitch to pursue higher integration of memory transistors. This arrangement, however, makes a distance between every two adjacent bit-line contacts so small that the bit-line contacts cannot be formed stably.

BRIEF DESCRIPTION OF THE DRAWINGS

FIG. 10A shows the first embodiment and FIG. 10B shows a reference example;

FIG. 11A is a diagram showing positions where contacts are to be formed in Example 1, FIG. 11B is a diagram showing a photomask, and FIG. 11C is a diagram showing a simulation result of the intensity distribution of a projected light;

FIG. 21A shows triple zigzag, FIG. 21B shows fourfold zigzag, and FIG. 21C shows fivefold zigzag;

FIG. 22A shows triple zigzag and FIG. 22B shows fourfold zigzag;

FIG. 30A is a diagram illustrating the lighting conditions of the example; and FIGS. 30B to 30D are plan views illustrating photomasks suitable for the lighting conditions shown in FIG. 30A;

DETAILED DESCRIPTION

Figure 1:
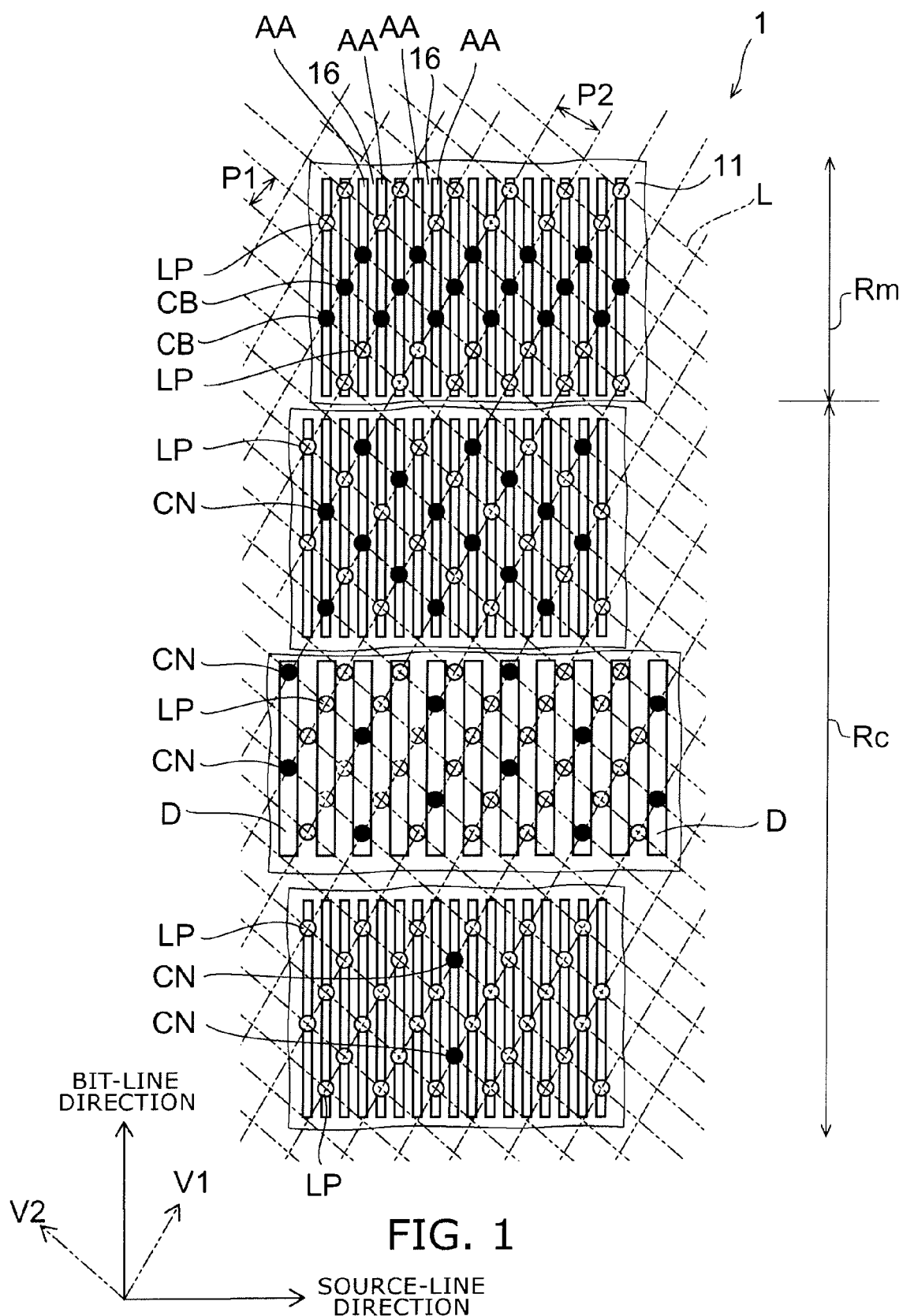
FIG. 1 is a plan view illustrating the arrangement of contacts of a semiconductor device according to a first embodiment.

In general, according to one embodiment, a semiconductor device includes a substrate, conductive members, an interlayer insulating film, and a plurality of contacts. The conductive members are provided in an upper portion of the substrate or above the substrate to extend in one direction. The interlayer insulating film is provided on the substrate and the conductive members. The plurality of contacts is provided in the interlayer insulating film. In a first region on the substrate, the contacts are located at some of lattice points of an imaginary first lattice. In a second region on the substrate, the contacts are located at some of lattice points of an imaginary second lattice. The second lattice is different from the first lattice. Each of the first lattice and the second lattice includes some of the lattice points located on the conductive members or on an extension region extended in the one direction of the conductive members. A position of each of the lattice points located on the conductive members and the extension region in the one direction is periodically displaced based on every n consecutively-arranged conductive members (n is a natural number).

According to another embodiment, a method is disclosed for manufacturing a semiconductor device. The method can include forming conductive members in an upper portion of a substrate or above the substrate to extend in one direction, forming an interlayer insulating film on the substrate and the conductive members, and forming a resist film on the interlayer insulating film. The method can expose the resist film by use of a photomask. The photomask includes a first region and a second region. The first region includes first light-transmissive regions provided at some of lattice points of an imaginary first lattice and second light-transmissive regions provided at least at some of remaining lattice points of the first lattice. The second region includes the first light-transmissive regions provided at some of lattice points of an imaginary second lattice and the second light-transmissive regions provided at least at some of remaining lattice points of the second lattice. The first light-transmissive regions are resolved when being projected on the photomask. The second light-transmissive regions are not resolved when being projected on the photomask. The second lattice is different from the first lattice. In addition, the method can develop the resist film, form contact holes in the interlayer insulating film by etching with the developed resist film used as a mask, and fill the contact holes with metal. When the first light-transmissive regions and the second light-transmissive regions of the first lattice and the second lattice are projected on the conductive members or an extension region extended in the one direction, a position of each of the first light-transmissive regions and the second light-transmissive regions projected on the conductive members or the extension region is displaced periodically based on every n consecutively-arranged conductive members (n is a natural number).

According to still another embodiment, a semiconductor device includes a substrate, conductive members, an interlayer insulating film, and a plurality of contacts. The conductive members are provided in an upper portion of the substrate or above the substrate to extend in one direction. The interlayer insulating film is provided on the substrate and the conductive members. The plurality of contacts penetrates the interlayer insulating film. At least some of the contacts are located at some of a plurality of lattice points arranged at a first pitch along a first direction as well as at a second pitch along a second direction intersecting with the first direction. A position of each of the contacts connected to the conductive members in the one direction is periodically displaced based on every three or more consecutively-arranged conductive members. Two or more contacts of the at least some of the contacts are connected to one of the conductive members.

According to still another embodiment, a method is disclosed for manufacturing a semiconductor device. The method can include forming conductive members in an upper portion of a substrate or above the substrate to extend in one direction, forming an interlayer insulating film on the substrate and the conductive members, and forming a resist film on the interlayer insulating film. The method can expose the resist film by use of a photomask. The photomask includes first light-transmissive regions provided at some of lattice points and second light-transmissive regions provided at least at some of remaining lattice points. The lattice points are arranged at a first pitch along a first direction as well as at a second pitch in a second direction intersecting with the first direction. The first light-transmissive regions are resolved when being projected on the resist film. The second light-transmissive regions are not resolved when being projected on the resist film. At least some of the first light-transmissive regions are projected on regions directly above the conductive members in the resist film and at a position where a position in the one direction is displaced periodically based on every three or more consecutively-arranged conductive members. Two or more of the first light-transmissive regions are projected on regions directly above one of the conductive members of the resist film. In addition, the method can develop the resist film, form contact holes in the interlayer insulating film by etching with the developed resist film used as a mask, and fill the contact holes with metal.

Hereinafter, embodiments of the invention will be described with reference to the drawings.

To begin with, a first embodiment will be described.

A semiconductor device according to this embodiment is a NAND flash memory.

Features of this embodiment are the way of arranging contacts. Thus, the arrangement of the contacts will be described, first.

FIG. 1 is a plan view illustrating the arrangement of contacts of the semiconductor device according to this embodiment.

As illustrated in FIG. 1, a silicon substrate 11 is provided in a NAND flash memory 1 according to this embodiment. In the silicon substrate 11, a memory-array region Rm and a peripheral-circuit region Rc are defined. The memory-array region Rm is a region that stores data, and includes multiple memory transistors serving as memory elements. The peripheral-circuit region Rc is a region that drives the memory-array region Rm, and includes a peripheral circuit. The peripheral circuit generates voltages of various levels, supplies the generated voltages to the memory-array region, and detects voltages or currents generated in the memory-array region.

In the memory-array region Rm, the upper portion of the silicon substrate 11 is divided, by STIs 16, into multiple line-shaped active areas AA extended in one direction. In addition, an interlayer insulating film (not illustrated) is provided on the silicon substrate 11. The interlayer insulating film is provided in both the memory-array region Rm and the peripheral-circuit region Rc. Multiple bit lines (not illustrated) are provided in regions directly above the active areas AA on the interlayer insulating film to extend in the same direction as the active areas AA. Hereinafter, the direction in which the active areas AA and the bit lines extend is referred to as a "bit-line direction."

Multiple contacts made of a conductive material such as a metal are provided in the interlayer insulating film so as to penetrate the interlayer insulating film. Some of the contacts are provided in the memory-array region Rm and serve as bit-line contacts CB that connect the bit lines to the active areas AA. The rest of the contacts are contacts that are not connected between the bit lines and the active areas AA. Hereinafter, such contacts other than the bit-line contacts CB are referred to as "non-bit-line contacts CN." In addition, the "bit-line contacts CB" and the "non-bit-line contacts CN" may be simply referred to as "contacts" in a collective manner. The non-bit-line contacts CN are provided at least in the peripheral-circuit region Rc. For example, the non-bit-line contacts CN connect the bit lines to diffusion regions D formed in the upper portion of the silicon substrate 11. With the non-bit-line contacts CN, a prescribed potential is applied to the bit lines or the potential of the bit lines is detected by a sense amplifier. Some of the conductive members, e.g., the diffusion regions D, are connected to two non-bit-line contacts CN. Here, "conductive member(s)" is used to mention collectively the constituent element(s) having conductivity and provided for the purpose of allowing the electric current to flow therethrough. The concept of the "conductive member(s)" includes, for instance, not only the active areas AA and the diffusion regions D but also the wirings and the like.

In this embodiment, all the contacts that penetrate the aforementioned interlayer insulating film, that is, the bit-line contacts CB and the non-bit-line contacts CN, are located at some of the lattice points LP of a single, imaginary two-dimensional lattice L. The lattice points LP are arranged at a pitch P1 along a direction V1 parallel to the top surface of the silicon substrate 11 as well as at a pitch P2 in a direction V2 parallel to the top surface of the silicon substrate 11 and intersecting the direction V1. The pitch P1 and the pitch P2 may be mutually equal or mutually different.

Accordingly, the lattice points LP include lattice points LP where contacts are formed and lattice points LP where no contacts are formed. In FIG. 1, the black circles (●) represent the lattice points LP with contacts, and the white circles represent the lattice points LP without contacts (○). Note that, in the actual NAND flash memory 1, the lattice points LP where no contacts are formed are not observable. All the lattice points LP are located on the active areas AA and on the imaginary regions formed by extending the active areas AA in the bit-line direction.

The positions of the bit-line contacts CB in the bit line direction displace periodically based on every three consecutively-arranged active areas AA used. Specifically, the positions of three bit-line contacts CB connected to three consecutively-arranged active areas AA are shifted from one another in the bit line direction, and the positions of bit-line contacts CB connected to any two of the active areas AA having two other active areas AA interposed therebetween are the same in the bit-line direction. Hereinafter, such an arrangement of contacts is referred to as "triple zigzag." In this embodiment, the direction V1 is a direction having the smallest arrangement pitch among the arrangement directions of the bit-line contacts CB. In addition, the direction V2 is a direction having the second smallest pitch among the arrangement directions of the bit-line contacts CB.

Next, the portions of the NAND flash memory 1 excluding the contacts will be described.

Figure 2:
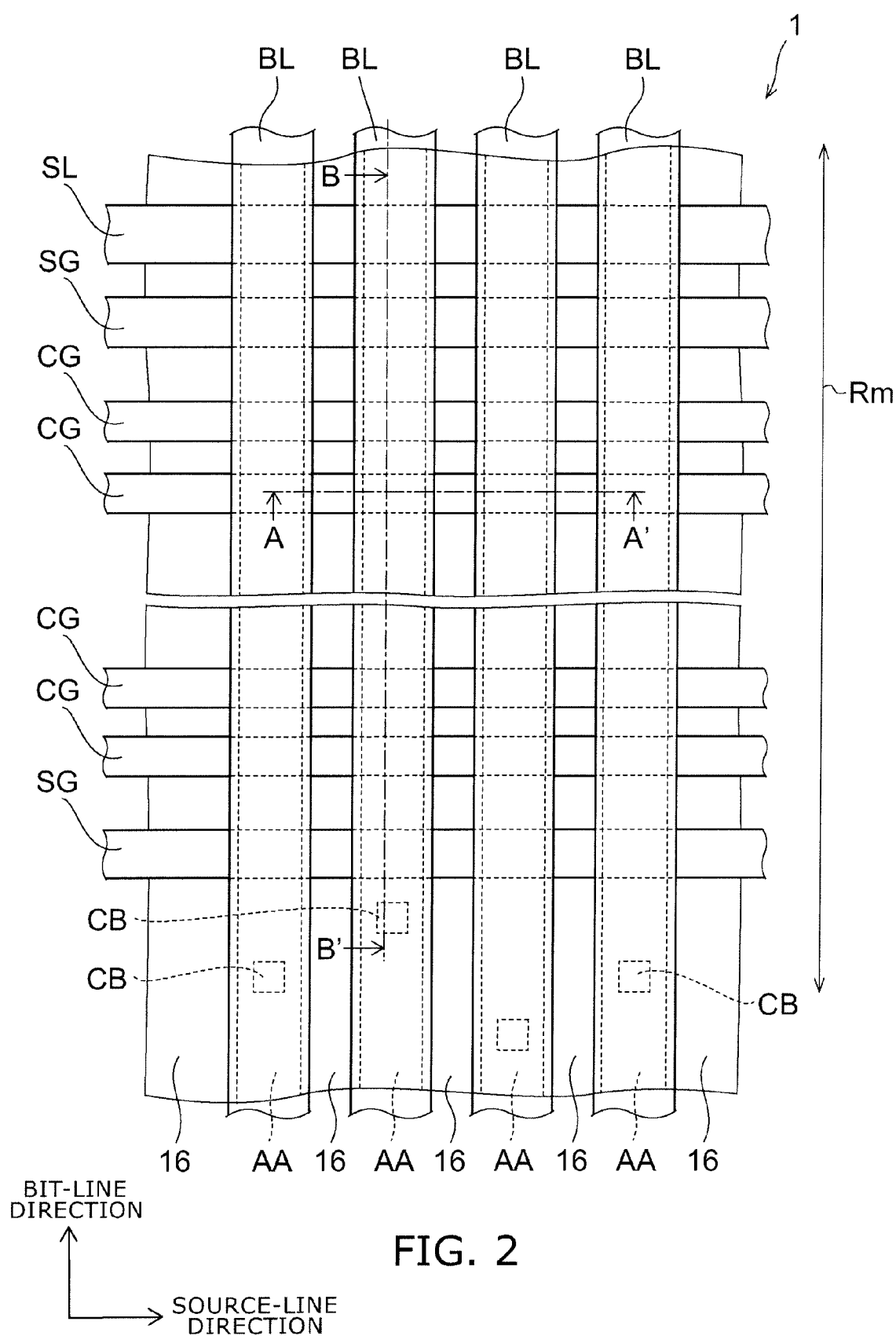
FIG. 2 is a plan view illustrating the semiconductor device according to the first embodiment.

FIG. 2 is a plan view illustrating the semiconductor device (NAND flash memory 1) according to this embodiment.

Figure 3:
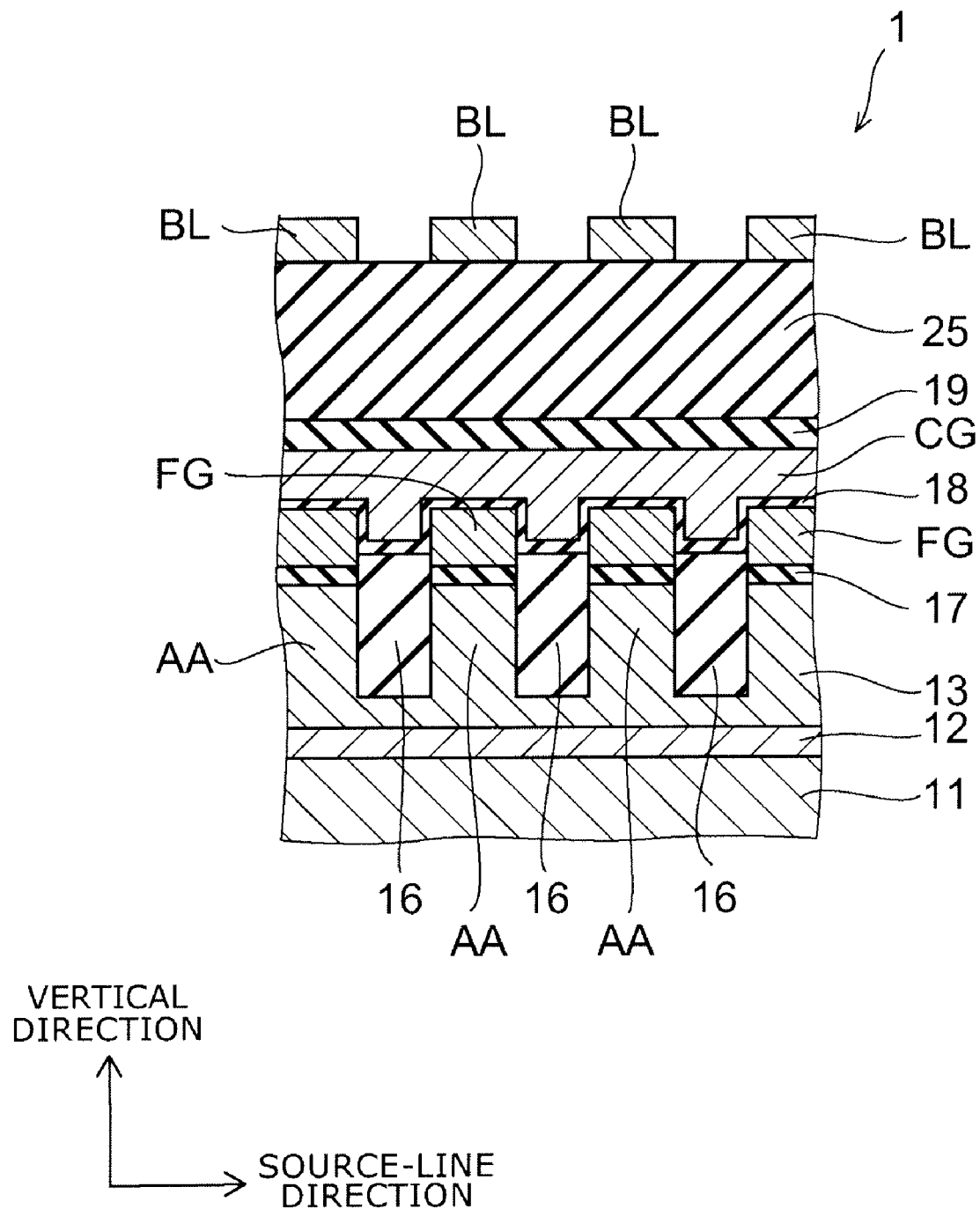
FIG. 3 is a cross-sectional view taken along line A-A' of FIG. 2.

FIG. 3 is a cross-sectional view taken along line A-A' of FIG. 2.

Figure 4:
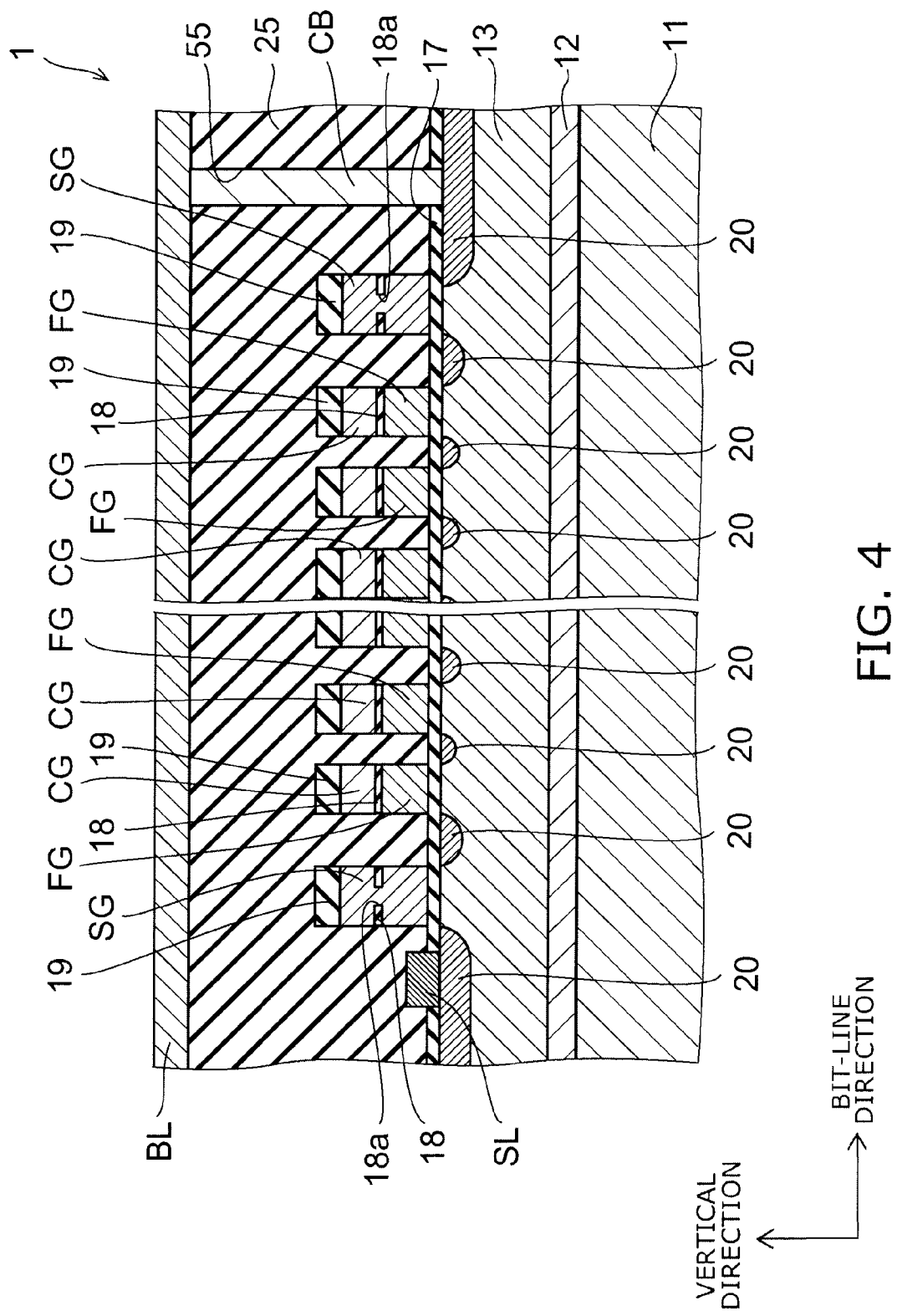
FIG. 4 is a cross-sectional view taken along line B-B' of FIG. 2.

FIG. 4 is a cross-sectional view taken along line B-B' of FIG. 2.

Hereinafter, a direction in parallel with the top surface of the silicon substrate 11 and, at the same time, orthogonal to the bit-line direction is referred to as a "source-line direction." All of the bit-line direction, the source-line direction, the direction V1, and the direction V2 are parallel with the top surface of the silicon substrate 11.

As illustrated in FIG. 2 to FIG. 4, in the memory-array region Rm, an n type well 12 is formed in the upper portion of the p type silicon substrate 11, and a p type well 13 is formed in a region of the upper portion of the n type well 12 except the peripheral portion. The aforementioned STIs 16 are made, for example, of a silicon oxide, and are formed in some portions of the upper portion of the p type well 13. The STIs 16 divide the upper portion of the p type well 13 into multiple active areas AA extending in the bit-line direction.

A tunnel insulating film 17 made of a silicon oxide is formed on each of the active areas AA. Although the tunnel insulating film 17 normally is insulative, the tunnel insulating film is a film in which a tunneling current flows when a prescribed voltage in the range of the drive voltage of the NAND flash memory 1 is applied. A floating gate electrode FG serving as a charge storage member is provided on the tunnel insulating film 17. The floating gate electrode FG is made of a conductive material such as a polysilicon with impurities introduced therein. The floating gate electrode FG is divided in a matrix configuration along the bit-line direction and the source-line direction and is located only in regions directly above the active areas AA.

A block insulating film 18 made, for example, of a silicon oxide or alumina or the like is provided on the floating gate electrode FG. The block insulating film 18 is a film in which no current substantially flows even when a prescribed voltage in the range of the drive voltage of the NAND flash memory 1 is applied. A control gate electrode CG made of a conductive material such as a polysilicon with impurities introduced therein is provided on the block insulating film 18. The control gate electrode CG has a line shape extending in the source-line direction and passes through regions directly above the multiple floating gate electrodes FG arranged along the source-line direction. Multiple control gate electrodes CG are provided along the bit-line direction.

A select gate electrode SG extending in the source-line direction is provided respectively in both sides of a region in the bit-line direction where multiple control gate electrodes CG are provided. Polysilicon forming the floating gate electrode FG and polysilicon forming the control gate electrode CG are integrated via an opening 18a of the block insulating film 18 to form the select gate electrode SG. An insulating film is provided on the control gate electrode CG and the select gate electrode SG.

An n type diffusion region 20 is formed in regions of the uppermost portion of the active areas AA except a region directly below the control gate electrode CG and a region below the select gate electrode SG. In other words, in each of the active areas AA, the n type diffusion region 20 is intermittently formed along the bit-line direction.

A line-shaped source line SL extending in the source-line direction is provided on one end portion of each of the active areas AA. The source line SL crosses the multiple active areas AA and is commonly connected to these active areas AA. On the other hand, as described above, a bit-line contact CB is provided on one other end portion of each of the active areas AA and are connected to the one other end portion of each of the active areas AA. The bit-line contact CB is provided inside a contact hole 55 formed in the interlayer insulating film 25.

Line-shaped bit lines BL made, for example, of a metal, are provided on the interlayer insulating film 25 to extend in the bit-line direction. Each of the bit lines BL is provided in a region directly above each of the active areas AA. A portion of each of the active areas AA corresponding to a region directly below the control gate electrode CG is sandwiched between a portion connected to the source line SL and a portion connected to the bit line BL.

The interlayer insulating film 25 made, for example, of silicon oxide is provided on the silicon substrate 11 so as to bury the floating gate electrode FG, the block insulating film 18, the control gate electrode CG, and the select gate electrode SG. The interlayer insulating film 25 is in contact with and thus is integrated with the insulating film 19 and the STIs 16.

In the NAND flash memory 1 with the aforementioned configuration, the source line SL is connected to the one end portion of the active area AA, and the bit line BL is connected to the one other end portion of the active area AA via the bit-line contact CB. In addition, a memory transistor with the floating gate electrode FG serving as a charge storage member is formed in every most proximal section of the control gate electrode CG and the active area AA. Moreover, a selection transistor is formed in the most proximal section of the select gate electrode SG and the active area AA. Accordingly, multiple memory transistors are connected in series between the bit line BL and the source line SL in every active area AA to form a memory string. The both sides of the memory string are connected to the selection transistors. In each memory string, the n type diffusion region 20 functions as a source-drain region for the memory transistor and the selection transistor. Multiple memory strings form a memory-cell array.

Next, a method of manufacturing the NAND flash memory 1 according to this embodiment will be described.

FIGS. 5A to 5C and FIGS. 6A to 6C are cross-sectional views of processes of the method of manufacturing the NAND flash memory according to this embodiment.

Figure 7:
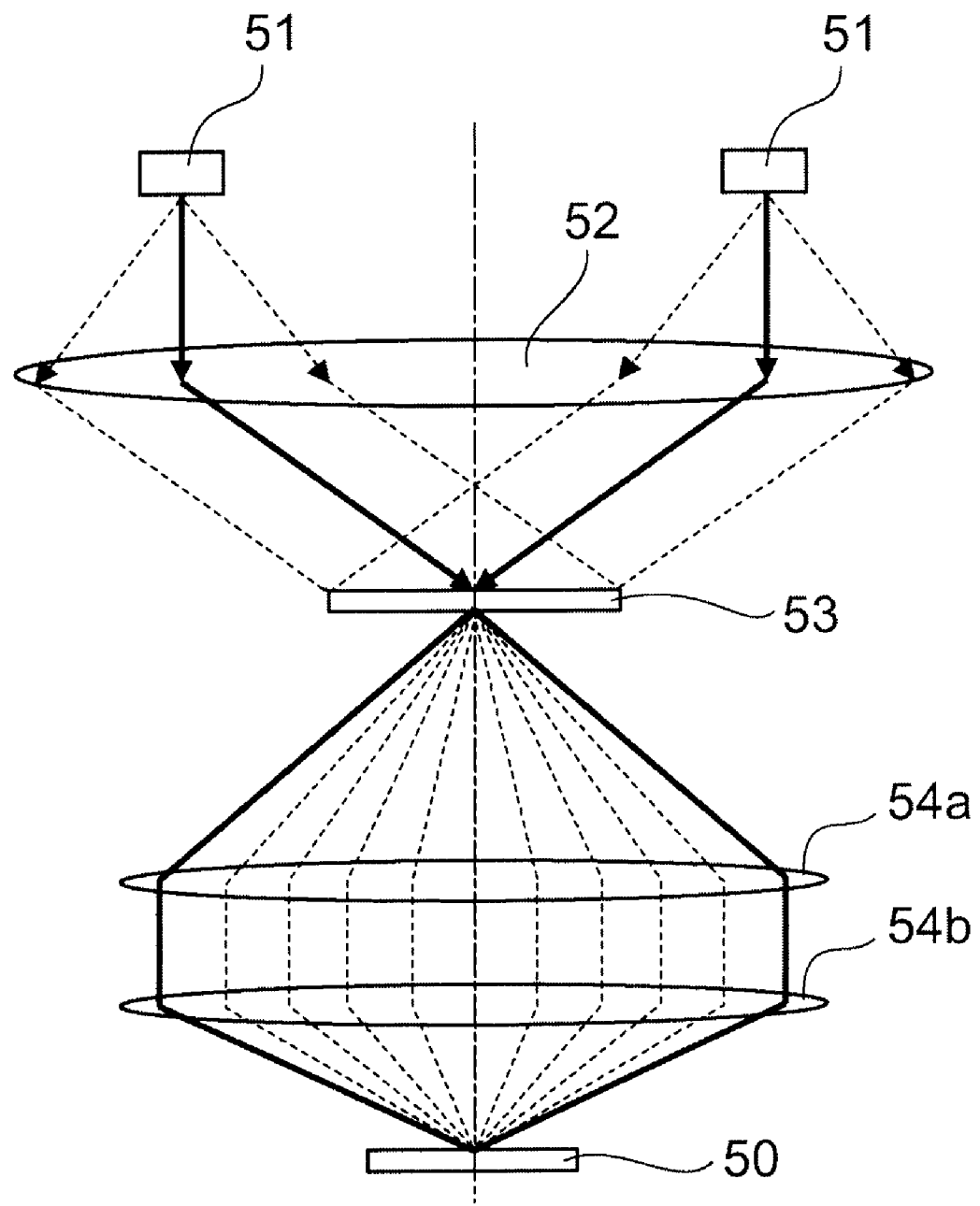
FIG. 7 is an optical-model diagram illustrating an exposure method according to the first embodiment.

FIG. 7 is an optical-model diagram illustrating an exposure method according to this embodiment.

Figure 8:
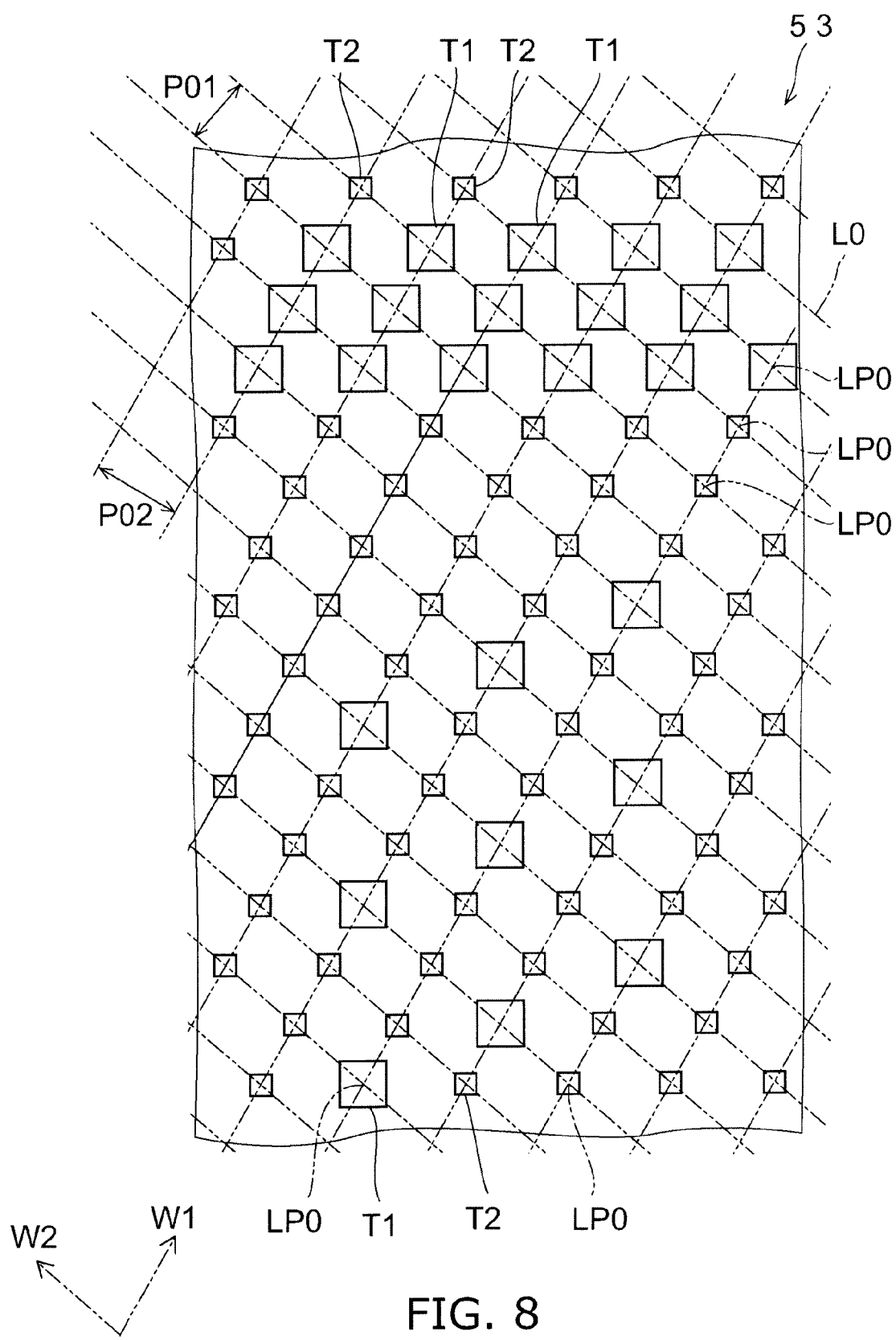
FIG. 8 is a plan view illustrating a photomask used in the first embodiment.

FIG. 8 is a plan view illustrating a photomask used in this embodiment.

Figure 9A:
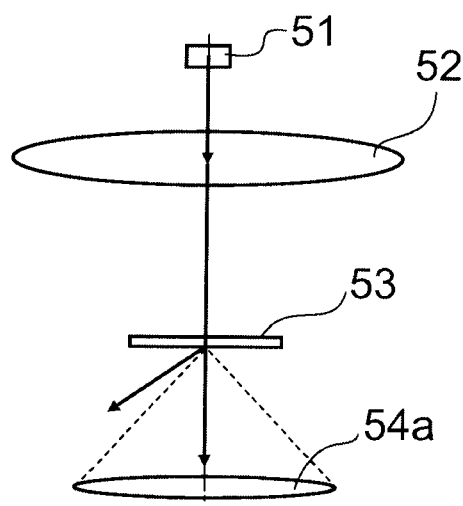
FIGS. 9A and 9B are optical-model diagrams illustrating the positional relationship of an optical system in the first embodiment.
Figure 9B:
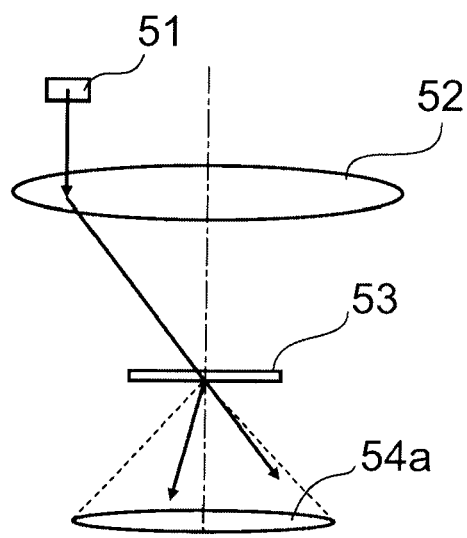
Figure 9C:
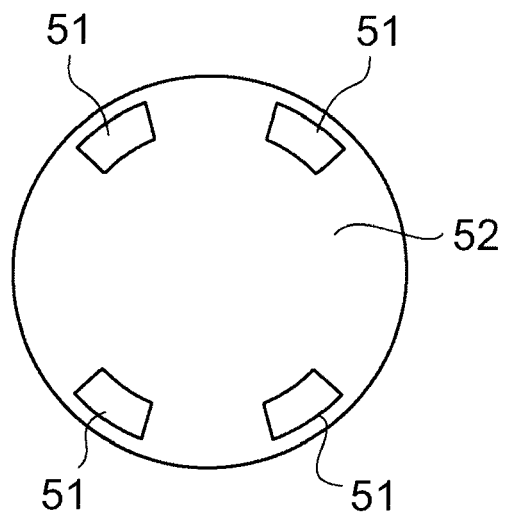
FIG. 9C is a diagram illustrating the positions of light sources.

FIGS. 9A and 9B are optical-model diagrams illustrating the positional relationship of an optical system according to this embodiment, and FIG. 9C is a diagram illustrating the positions of light-sources.

Figure 5A:
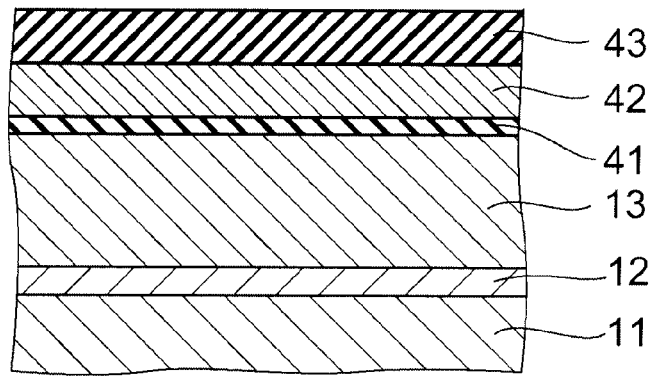
FIGS. 5A to 5C are cross-sectional views of processes of a method of manufacturing the semiconductor device according to the first embodiment.

To begin with, as illustrated in FIG. 5A, a p type silicon substrate 11 is prepared. A portion of a silicon wafer may be used as the silicon substrate 11. The silicon substrate 11 is divided into a memory-array region Rm and a peripheral-circuit region Rc. Then, in the memory-array region Rm, an n type well 12 is formed in the upper portion of the silicon substrate 11 and a p type well 13 is formed in the upper portion of the n type well 12. Then, an insulating film 41 is formed on the p type well 13 by depositing, for example, a silicon oxide. Then, a conductive film 42 is formed by depositing a conductive material, such as a polysilicon with impurities introduced therein. Then, an insulating film 43 is formed.

Figure 5B:
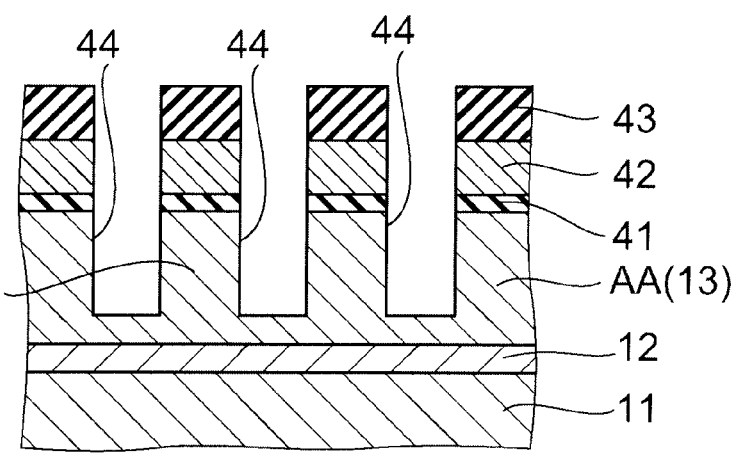

Subsequently, as illustrated in FIG. 5B, trenches 44 are formed in the memory-array region. Each of the trenches 44 penetrates the insulating film 43, the conductive film 42, and the insulating film 41, and reaches at a depth such that the p type well 13 is dug halfway for the trenches 44. As a result, the conductive film 42 and the insulating film 41 are processed into multiple line-shaped members extended in the bit-line direction, and the upper portion of the p type well is divided into multiple active areas AA extended in the bit-line direction.

Figure 5C:
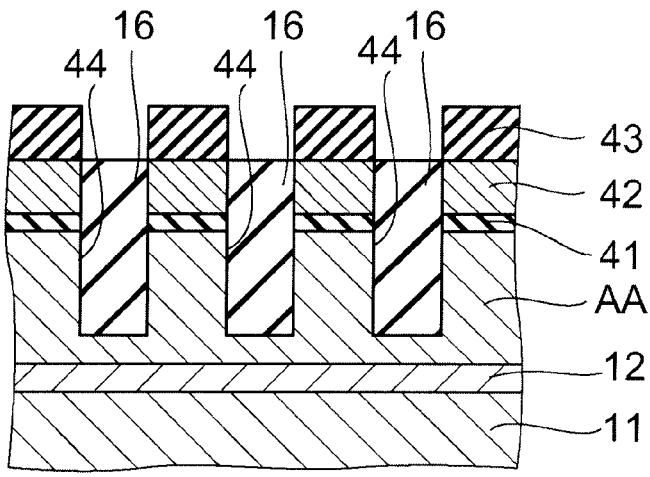

Subsequently, as illustrated in FIG. 5C, STIs 16 are formed by filling an insulating material such as a silicon oxide into the trenches 44. At this time, the position of the top surfaces of the STIs 16 is approximately at the same level as the position of the interface between the conductive film 42 and the insulating film 43. Then, the insulating film 43 is removed.

Figure 6A:
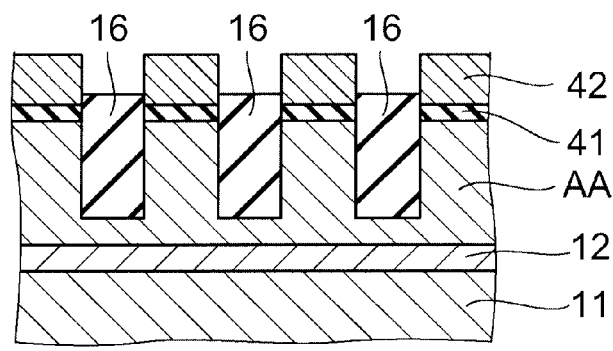
FIGS. 6A to 6C are cross-sectional views of processes of the method of manufacturing the semiconductor device according to the first embodiment.

Subsequently, as illustrated in FIG. 6A, the upper portions of the STIs 16 are removed by etching such as RIE with respect to the memory-array region Rm to lower the top surfaces of the STIs 16.

Figure 6B:
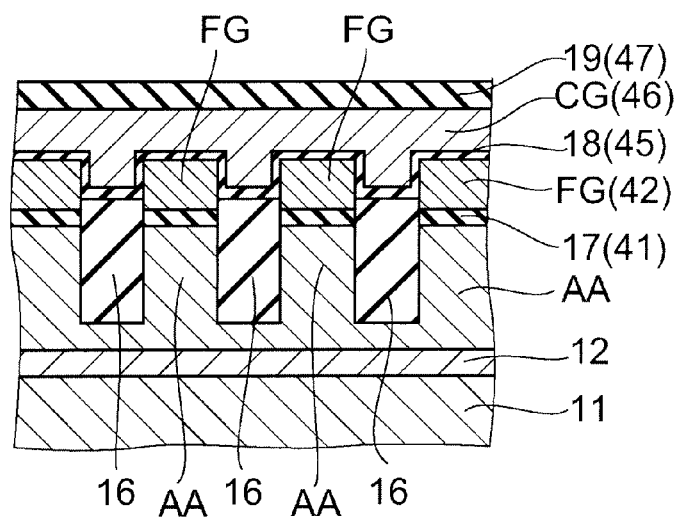

Subsequently, as illustrated in FIG. 6B, an insulating film 45 is formed on the conductive film 42. At this time, in a region where a select gate electrode SG is to be formed, an opening portion 18a (see FIG. 4) is formed in the insulating film 45. Then, a conductive film 46 is formed, and then an insulating film 47 is formed. A patterning process is performed by the photolithography technique to divide the insulating film 47, the conductive film 46, the insulating film 45, the conductive film 42, and the insulating film 41 along the bit-line direction. The insulating film 47 is thus divided and forms a line-shaped insulating film 19 extended in the source-line direction. The conductive film 46 is thus divided and forms a line-shaped control gate electrode CG extended in the source-line direction. The insulating film 45 is thus divided and forms a line-shaped block insulating film 18 extended in the source-line direction.

In addition, the conductive film 42 is divided and forms a floating gate electrode FG. The insulating film 41 is divided and forms a tunnel insulating film 17. The conductive film 42 and the insulating film 41 are divided along the source-line direction in the process shown in FIG. 5B and are divided along the bit-line direction in this process. Consequently, the floating gate electrode FG and the tunnel insulating film 17 are divided in a matrix along the source-line direction and the bit-line direction. In addition, the floating gate electrode FG is connected to the control gate electrode CG via the opening portion 18a of the block insulating film 18, thereby forming a select gate electrode SG. Moreover, a source line SL is formed on the silicon substrate 11.

Subsequently, an impurity serving as a donor is ion-implanted to the silicon substrate 11 by using the control gate electrode CG and the select gate electrode SG as a mask. Thereby, an n type diffusion region 20 (see FIG. 4) is formed, in a self-aligning manner, in a region of the upper portion of the active area AA between regions directly below the control gate electrode CG and the select gate electrode SG.

Figure 6C:
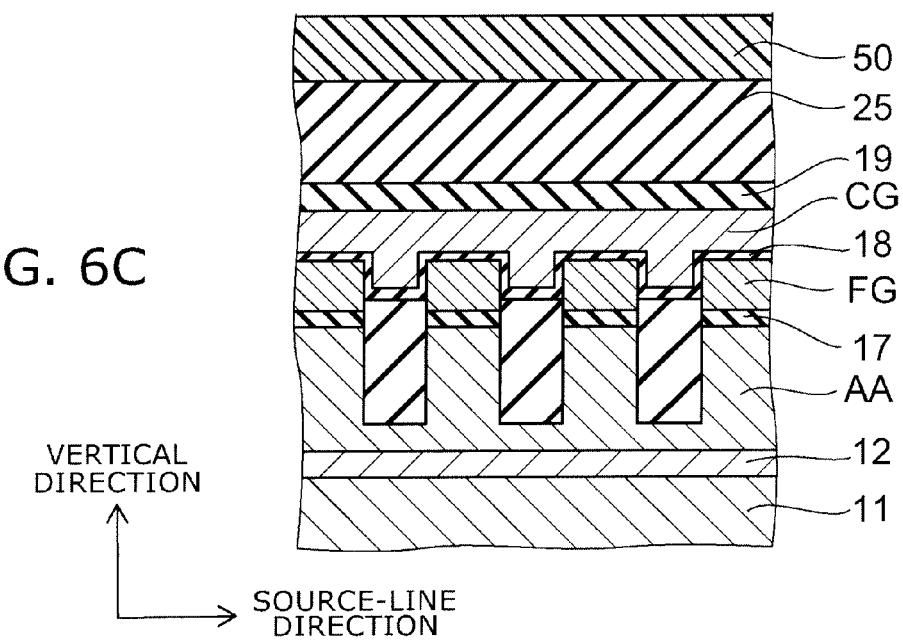

Subsequently, as illustrated in FIG. 6C, an interlayer insulating film 25 is formed by depositing an insulating material such as a silicon oxide on the silicon substrate 11 so as to cover the tunnel insulating film 17, the floating gate electrode FG, the block insulating film 18, the control gate electrode CG, and the insulating film 19. Then, a resist film 50 is formed in the entire surface on the interlayer insulating film 25.

Subsequently, the resist film 50 is exposed. At this time, as illustrated in FIG. 7, a lens 52, a photomask 53, and lenses 54a and 54b are arranged in this order from a light source side between the light source 51 and the resist film 50. Note that, optical elements other than the ones described above may be intervened in an optical path from the light source 51 to the resist film 50.

As illustrated in FIG. 8, light-transmissive regions T1 and T2 are formed in the photomask 53. The light-transmissive regions T1 and T2 allow exposing light emitted from the light source 51 to pass therethrough. The light-transmissive region T1 is a region in which a projection image is resolved when the exposing light emitted from the light source 51 reaches the resist film 50 via the photomask 53. The light-transmissive region T2 is smaller in size than the light-transmissive region T1. The light-transmissive region T2 is a region in which a no projection image is resolved when the exposing light emitted from the light source 51 reaches the resist film 50 via the photomask 53. The light-transmissive region T2 is SRAF (sub-resolution assist features) to enhance the resolution of other patterns. Other regions in the photomask 53 except the light-transmissive regions T1 and T2 are light-blocking regions to block the exposing light. The light-transmissive regions T1 and T2 have a square shape, for example. Although it is not necessary for the light-transmissive regions T1 and T2 to be a square shape, but need to be a shape that corresponds to the lattice point. Such a shape may be a circular shape, for example.

All the light-transmissive regions T1 and T2 are located at lattice points LP0 of a single, imaginary two-dimensional lattice L0. The lattice points LP0 are arranged at a pitch P01 along a direction W1 parallel to the surface of the photomask 53. At the same, the lattice points LP0 are arranged at a pitch P02 along a direction W2 parallel to the surface of the photomask 53 and intersecting with the direction W1. The two-dimensional lattice L0 is a lattice in which a two-dimensional lattice L appears when projected on the resist film 50. Specifically, each lattice point LP0 of the two-dimensional lattice L0 corresponds to each lattice point LP of the two-dimensional lattice L; the directions W1 and W2 of the two-dimensional lattice L0 correspond to the directions V1 and V2 of the two-dimensional lattice L; and the pitches P01 and P02 of the two-dimensional lattice L0 correspond to the pitches P1 and P2 of the two-dimensional lattice L. For example, the two-dimensional lattice L0 and the two-dimensional lattice L are like figures.

Of the lattice points LP0 of the photomask 53, the light-transmissive regions T1 are formed in lattice points LP0 that correspond to regions where contacts are to be formed in the NAND flash memory 1. In other words, the light-transmissive region T1 is formed at a position such that a region directly above a region where a contact is to be formed by exposure in the resist film 50 is to be projected. The light-transmissive regions T2, on the other hand, are formed at the remaining lattice points LP0 of the photomask 53, that is, at the lattice points LP0 where no light-transmissive region T1 are formed.

The photomask 53 is located so that the all the lattice points LP0 are projected on regions directly above the active areas AA in the resist film 50 and regions directly above the regions formed by extending the active areas AA in the bit-line direction as well as some of the light-transmissive regions T1 are projected on regions directly above the active areas AA in the resist film 50. Further, the photomask 53 is formed so that the positions of the projection images of the light-transmissive regions T1 in the bit-line direction, which are projected on regions directly above the active areas AA, are displaced periodically based on every three consecutively-arranged active areas AA. Moreover, in the photomask 53, of the arrangement directions of the light-transmissive regions T1 projected on regions directly above the active areas AA, the direction W1 is made to coincide with an arrangement direction that has the smallest pitch. On the other hand, of the arrangement directions of the light-transmissive regions T1 projected on regions directly above the active areas AA, the direction W2 is made to coincide with an arrangement direction that has the second smallest pitch.

As described above, in the photomask 53, the light-transmissive regions T1 and T2 are periodically formed, and the exposing light is diffracted when passing through the photomask 53. Accordingly, in certain incident directions of the exposing light as illustrated in FIG. 9A, light diffracted by the photomask 53 does not enter the lens 54a. In order to make the diffracted exposing light enter to the lens 54a as illustrated in FIG. 9B, it is necessary to adjust the incident direction of the exposing light appropriately. In this embodiment, since the light-transmissive regions T1 and T2 are located at the lattice points LP0 of the two-dimensional lattice L0, the positions of the light sources 51 are four as illustrated in FIG. 9C.

As illustrated in FIG. 7, the light sources 51 emit exposing lights; the lens 52 makes the traveling direction of those exposing lights parallel; the exposing lights that become parallel lights pass through the light-transmissive regions T1 and T2 of the photomask 53; the exposing lights are collected by the lenses 54a and 54b; and the collected exposing lights reach the resist film 50. At this time, the lights passed through the light-transmissive region T1 are resolved in the resist film 50 so that the resist film 50 is exposed. On the other hand, the lights passed through the light-transmissive region T2 are not resolved in the resist film 50 so that the resist film 50 is not exposed sufficiently. After that, the resist film 50 is developed. Thereby, an exposed portion of the resist film 50 is removed.

Subsequently, as illustrated in FIG. 2 to FIG. 4, contact holes 55 are formed in the interlayer insulating film 25 by an etching process using the developed resist film 50 as a mask. Then, bit-line contacts CB and non-bit-line contacts CN are formed by filling the contact holes 55 with a high-melting-point metal, such as tungsten (W) and molybdenum (Mo). Then, a material, such as a metal, is deposited and then the deposited material is formed into lines by an anisotropic etching process. Bit lines BL are thus formed. Note that, in this embodiment, the term, "metal" means conductive materials including pure metals, alloys, metal nitrides, and the like. Then, the silicon wafer is diced into the silicon substrate 11. The NAND flash memory 1 of this embodiment is manufactured in this way.

Next, effects of this embodiment will now be described.

The photomask 53 used in this embodiment has the light-transmissive regions T1 and T2 arranged in the shape of a two-dimensional lattice. For this reason, the photomask 53 diffracts light with higher directivity. Accordingly, the utilization efficiency of the exposing light can be improved by appropriately arranging the light source 51, and an exposure margin can be sufficiently secured.

In addition, of the lattice points LP0 of the two-dimensional lattice L0 of the photomask 53, the light-transmissive regions T1 are formed at arbitrarily selected lattice points LP0 and the light-transmissive regions T2 are formed at the remaining lattice points LP0. Accordingly, of the lattice points LP of the two-dimensional lattice L projected on the resist film 50, contacts can be formed at arbitrarily selected lattice points LP. When the contacts are formed, the positions of the contacts can be determined with a higher degree of freedom. Consequently, the contacts can be formed at any positions that the structure of the NAND flash memory 1 requires. For example, as illustrated in FIG. 1, while one bit-line contact CB is connected to each of the active areas AA in the memory-array region Rm, two non-bit-line contacts CN are respectively connected to every other diffusion regions D in some of the peripheral-circuit region Rc and two non-bit-line contacts CN are connected to only one diffusion region D in the other peripheral-circuit region Rc.

In addition, in the NAND flash memory 1, the arrangement pitch of the active areas AA is the smallest of the arrangement pitches of the constitutional elements of the NAND flash memory 1. If all the lattice points LP of the two-dimensional lattice L projected on the resist film 50 are arranged on the active areas AA and on the extension regions formed by extending the active areas AA in the bit-line direction, all the lattice points LP can be used effectively as the potential positions where contacts can be formed. Accordingly, the lattice points LP do not have to be set in the NAND flash memory 1 with unnecessarily high density. Accordingly, the light-transmissive regions T2 do not have to be formed in the photomask 53 with unnecessarily high density. Thus, such a photomask 53 can be easily fabricated.

In addition, in this embodiment, the positions of the bit-line contacts CB in the bit-line direction are periodically displaced based on every three consecutively-arranged active areas AA. Accordingly, two bit-line contacts CB having the same position in the bit-line direction are separated from each other with two active areas AA interposed therebetween. As a result, a distance can be secured between the two bit-line contacts CB, and the constraint imposed by the resolution limit of the photolithography technique can be avoided.

In addition, in the photomask 53 of this embodiment, of the arrangement directions of the light-transmissive regions T1 projected on regions directly above the active areas AA, the direction W1 is made to coincide with a direction that has the smallest pitch. Accordingly, in the NAND flash memory 1, of the arrangement directions of the bit-line contacts CB, the direction V1 is made to coincide with a direction that has the smallest pitch. As a result, the pitches P01 and P02 of the two-dimensional lattice L0 can be obtained widely in the photomask 53, and the light-transmissive regions T2 serving as SRAFs are not formed more than necessary. Thus, such a photomask 53 can be easily fabricated.

The effects will be described in detail by referring to the drawings.

Figure 10A:
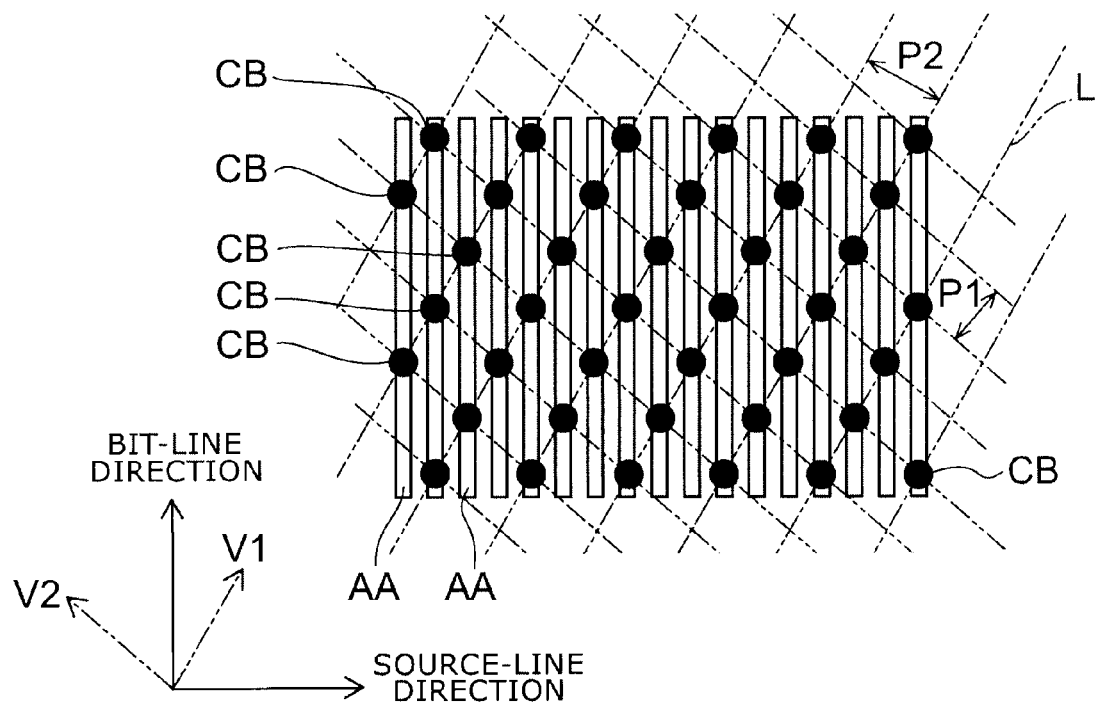
FIGS. 10A and 10B are plan views illustrating the arrangement of bit-line contacts and a two-dimensional lattice, where
Figure 10B:
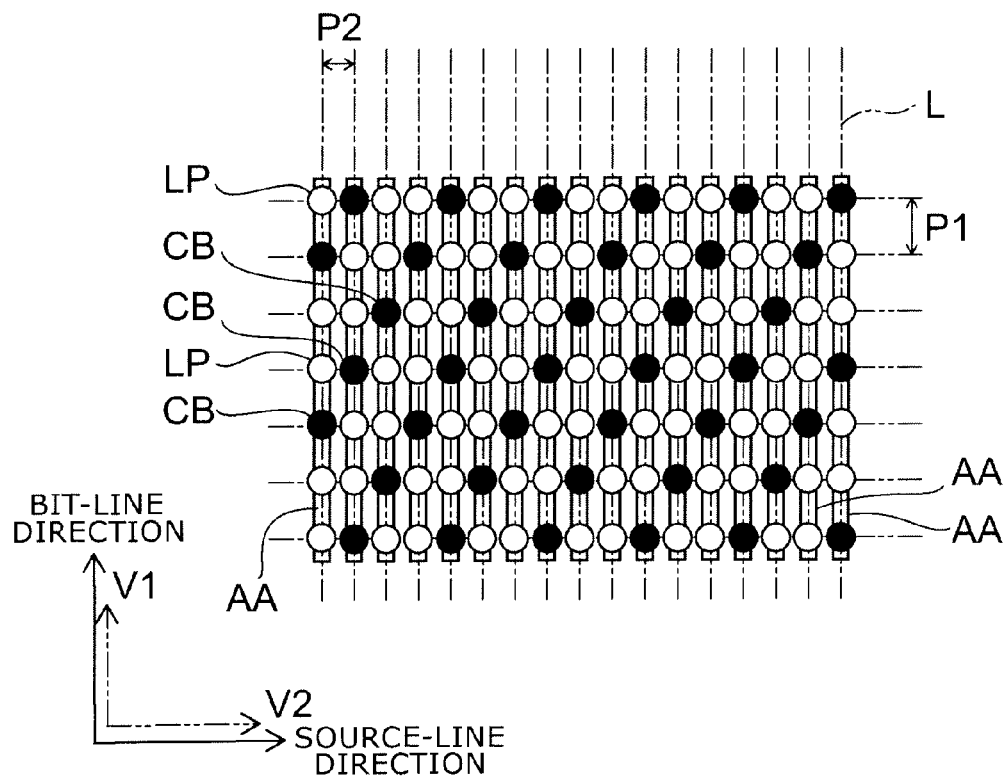

FIGS. 10A and 10B are plan views showing the arrangement of the bit-line contacts and the two-dimensional lattice. FIG. 10A shows this embodiment, and FIG. 10B shows a reference example.

As shown in FIG. 10A, in this embodiment, of the arrangement directions of the bit-line contacts CB, the direction V1 of the two-dimensional lattice L is made to coincide with a direction that has the smallest pitch. Accordingly, the pitches P1 and P2 of the two-dimensional lattice L become larger, and the lattice points LP with no contacts are reduced. Note that the direction V2 is a direction that intersects with the direction V1. As long as the direction V2 coincides with one of the arrangement directions of the bit-line contacts CB, it is not necessary for the direction V2 to be the second smallest direction.

In contrast, in the reference example as illustrated in FIG. 10B, although the arrangement of the bit-line contacts CB is the same as that of this embodiment shown in FIG. 10A, the direction V1 coincides with the bit-line direction and the direction V2 coincides with the source-line direction. According to this as well, all the lattice points LP can be arranged on the active areas AA and on the extension regions of the active areas AA, and all the contacts can be arranged at some of the lattice points LP. In this case, however, the pitches P1 and P2 of the two-dimensional lattice L become smaller. Accordingly, no pattern may be resolved depending on the wavelength of light used for exposure and the numerical aperture (NA) of the exposure apparatus. In addition, the lattice points LP with no contacts are increased. In the photomask 53, it is necessary to improve the resolution of the pattern to be transferred by forming the light-transmissive regions T2 at the lattice points LP0 corresponding to the lattice points LP with no contacts. Thus, the light-transmissive regions T2 are formed more than necessary in the photomask 53, and the fabrication of the photomask 53 becomes difficult.

In addition, in this embodiment, two non-bit-line contacts CN are connected to a common diffusion region D in the peripheral-circuit region Rc. Accordingly, the risk of faulty opening of the contacts can be reduced, or the contact resistance can be reduced. In this embodiment, two bit-line contacts CB may be connected to a common active area AA in the memory-array region Rm. Accordingly, the risk of faulty opening of the contacts can be reduced, or the resistance between the bit-line contacts CB and the active areas AA can be reduced. Alternatively, two or more contacts may be connected to conductive members to which the same potential is supplied. Such conductive members are an active area AA and a wire that are arranged in the bit-line direction and connected to each other, or the like.

In addition, according to this embodiment, all the contacts to be formed in the interlayer insulating film 25 can be formed at a single process. Accordingly, the manufacturing cost of the NAND flash memory 1 can be reduced.

In addition, this embodiment shows an example, which the direction V1 and the direction V2 forming the two-dimensional lattice L differ from the bit-line direction and the source-line direction. However, either one of the direction V1 and the direction V2 may coincide with the bit-line direction or the source-line direction. Alternatively, as long as the fabrication of the photomask does not become difficult, the direction V1 and the direction V2 may coincide with the bit-line direction and the source-line direction, respectively.

In addition, this embodiment shows an example, which the interlayer insulating film 25 where the contacts are formed is formed at a single film-forming process. The invention, however, is not limited thereto. The interlayer insulating film 25 may be formed in several processes. Even in such a case, as long as the insulating films are provided in a common layer, the insulating films can be considered as a single interlayer insulating film, and the contact holes formed therein can be formed by a single exposure.

In addition, this embodiment shows an example, which the positions of the bit-line contacts CB in the bit-line direction are periodically displaced for every three active areas AA. The invention, however, is not limited thereto. For example, the positions of the bit-line contacts CB may be periodically displaced based on every four or more consecutively-arranged active areas AA.

In addition, this embodiment shows an example, which the semiconductor device is a NAND flash memory. The invention, however, is not limited thereto. The invention is applicable to any semiconductor device having multiple contacts formed in a single layer. In such a case, it is preferable that all the lattice points of the two-dimensional lattice are arranged on the conductive members extended in one direction with the smallest arrangement pitch of all the conductive members in the semiconductor device and on the extension regions formed by extending the conductive members in one direction. Accordingly, even if some of the contacts are connected to the conductive members with the smallest arrangement pitch, an exposure margin can be secured.

Next, specific examples that show the effects of this embodiment will be described in comparison to comparative examples.

To begin with, Example 1 of this embodiment will be described.

FIG. 11A is a diagram showing positions where contacts are to be formed in Example 1, FIG. 11B is a diagram showing a photomask, and FIG. 11C is a diagram showing a simulation result of the intensity distribution of the projected light.

Figure 12:
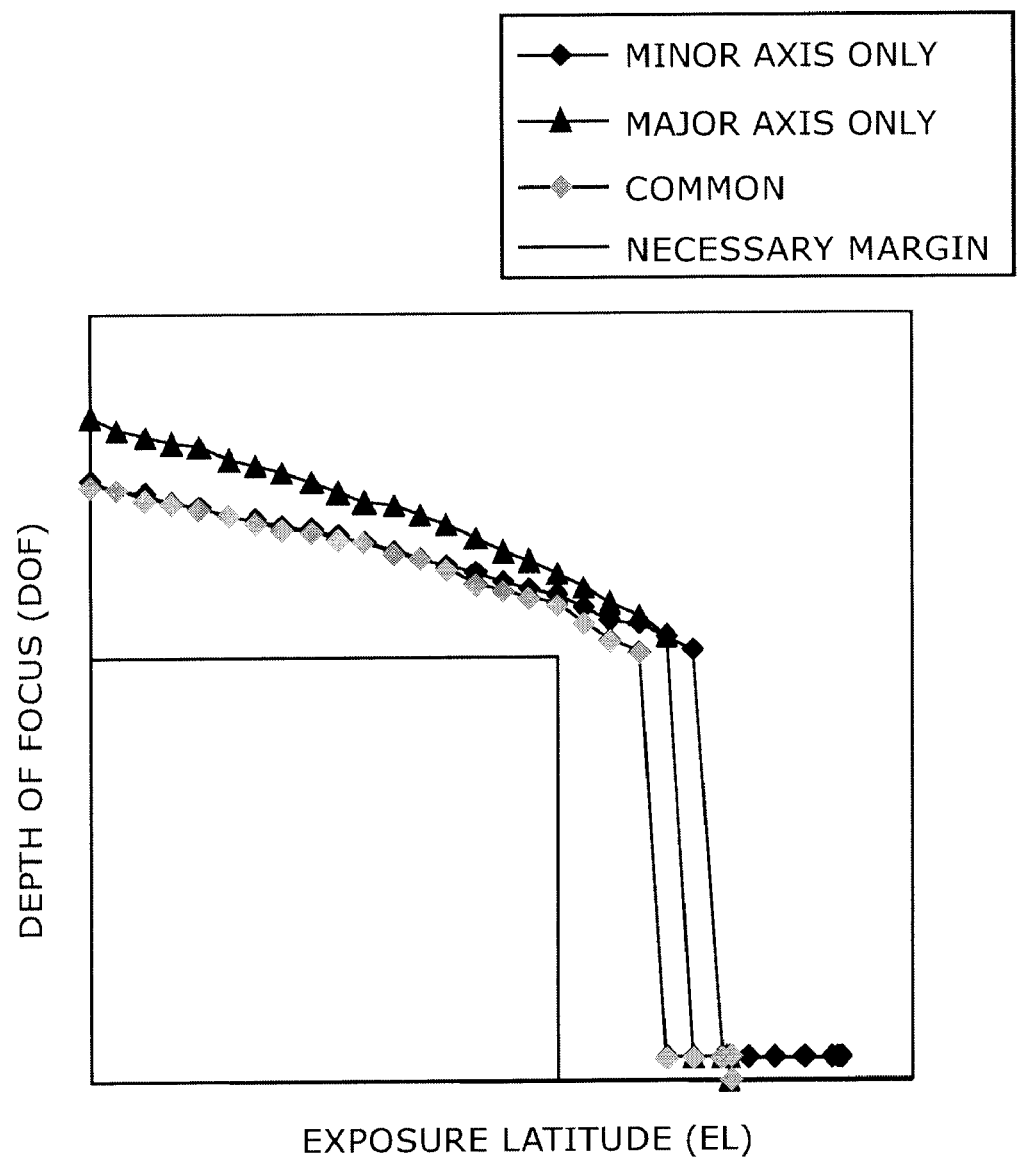
FIG. 12 is a graph showing an exposure margin of Example 1, where the horizontal axis represents the exposure latitude and the vertical axis represents the depth of focus.

FIG. 12 is a graph showing an exposure margin of Example 1, where the horizontal axis represents the exposure latitude (EL) and the vertical axis represents the depth of focus (DOF).

If all plots that represent the relationship between the exposure latitude (EL) and the depth of focus (DOF) are outside of the necessary margin, the contact holes can be formed stably in this example. On the other hand, if at least some of the plots are within the necessary margin, the ordinary fluctuation of the exposure conditions inevitably causes defects, so that the contact holes cannot be formed stably. The same holds for other examples and comparative examples described below.

As illustrated in FIG. 11A, the contacts to be formed in Example 1 are assumed to be the bit-line contacts CB in the aforementioned embodiment. Specifically, all the bit-line contacts CB are assumed to be located at the lattice points of the two-dimensional lattice. In addition, the positions of the bit-line contacts CB in the bit-line direction are assumed to be displaced periodically based on every three consecutively-arranged active areas AA. However, unlike the aforementioned embodiment, multiple bit-line contacts are connected to each of the active areas AA.

As illustrated in FIG. 11B, a photomask 61 is used as the photomask. In the photomask 61, the light-transmissive regions T1 and T2 are arranged in a two-dimensional matrix configuration. Specifically, the light-transmissive regions T1 and T2 are located at the lattice points of an imaginary two-dimensional lattice (not illustrated). When one of the light-transmissive regions T1 is assumed to be a base point, the light-transmissive regions T1 and T2 are alternately located in a direction W1 with a smallest arrangement pitch of the light-transmissive regions T1 and T2 as well as in a direction W2 with a second smallest arrangement pitch. Only the light-transmissive regions T1 are consecutively arranged in a direction W3 with the third smallest arrangement pitch and in a direction W4 with the fourth smallest arrangement pitch. The light sources are arranged as illustrated in FIG. 9C as described above. The same holds for other examples and comparative examples described below.

The simulation result shown in FIG. 11C reveals that the intensity distribution of the exposing light that pass through the light-transmissive regions T1 of the photomask 61 has strong peaks at all the positions corresponding to the bit-line contacts CB of FIG. 11A, but no strong peaks are observed at the other positions. In addition, as illustrated in FIG. 12, an exposure margin can be sufficiently secured. According to Example 1, the contacts shown in FIG. 11A can be formed stably.

Next, Example 2 of this embodiment will be described.

Figure 13A:
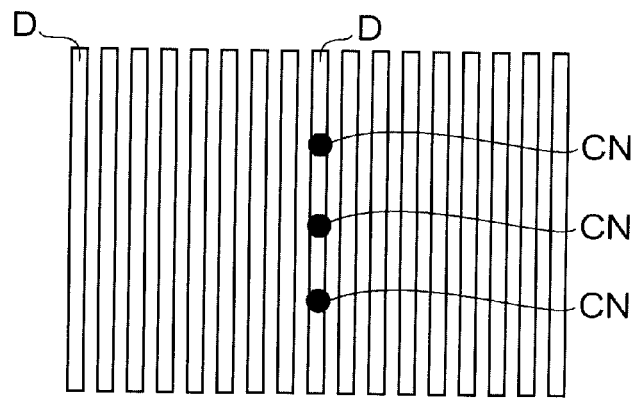
FIG. 13A is a diagram showing positions where contacts are to be formed in Example 2.
Figure 13B:
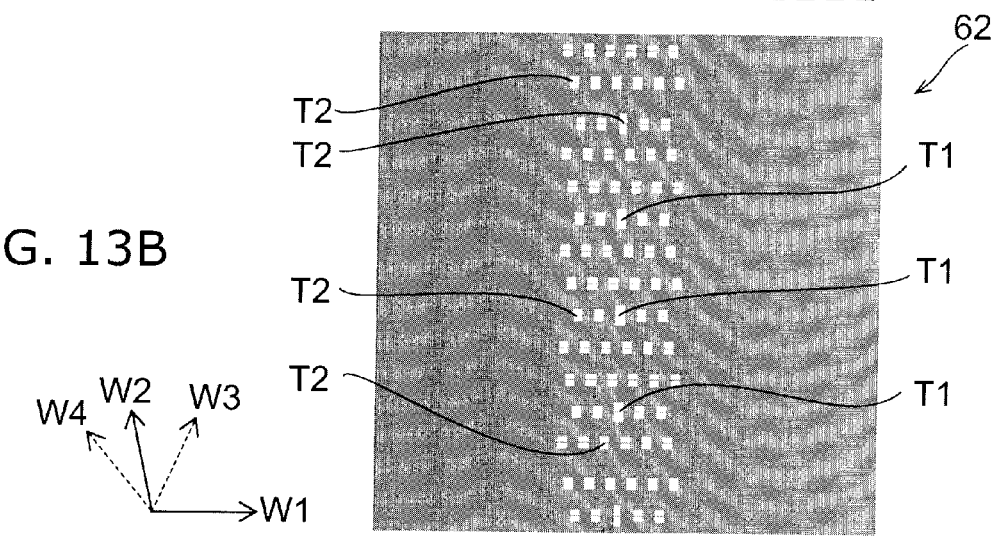
FIG. 13B is a diagram showing a photomask.
Figure 13C:
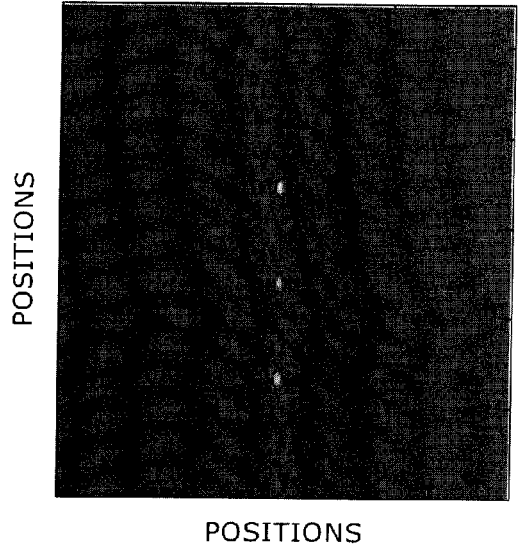
FIG. 13C is a diagram showing a simulation result of the intensity distribution of a projected light.

FIG. 13A is a diagram showing positions where contacts are to be formed in Example 2, FIG. 13B is a diagram showing a photomask, and FIG. 13C is a diagram showing a simulation result of the intensity distribution of the projected light.

Figure 14:
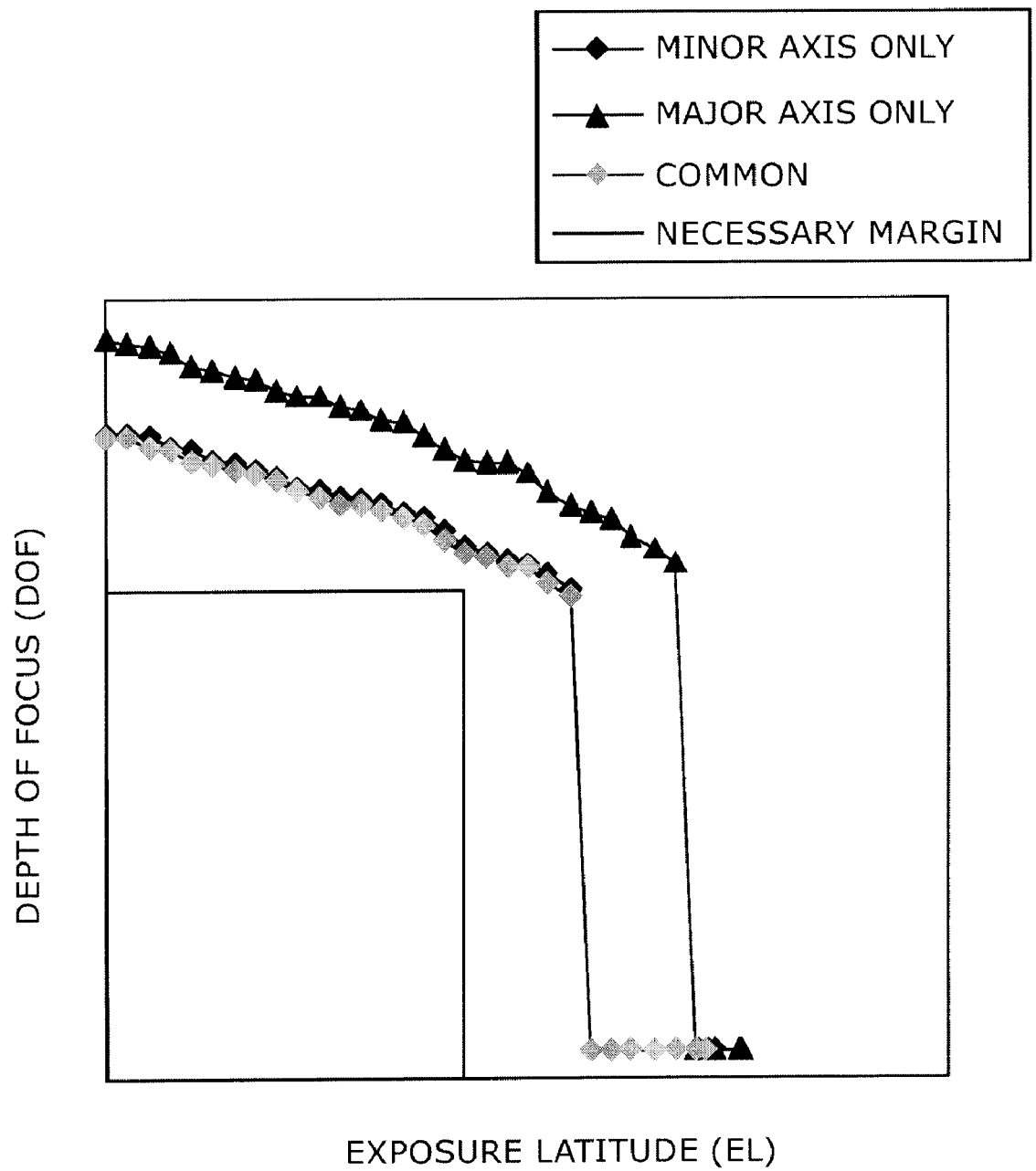
FIG. 14 is a graph showing an exposure margin of Example 2, where the horizontal axis represents the exposure latitude and the vertical axis represents the depth of focus.

FIG. 14 is a graph showing an exposure margin of Example 2, where the horizontal axis represents the exposure latitude (EL) and the vertical axis represents the depth of focus (DOF).

As illustrated in FIG. 13A, a case is assumed in Example 2 where three non-bit-line contacts CN are connected to a one, line-shaped diffusion region D (conductive member). In this case, as illustrated in FIG. 13B, a photomask 62 is used as the photomask. In the photomask 62, three light-transmissive regions T1 are equidistantly arranged along one direction, and multiple light-transmissive regions T2 are formed in a strip-shaped region around the light-transmissive regions T1. The light-transmissive regions T1 and T2 are located at the lattice points of an imaginary two-dimensional lattice that has the same shape as the shape of the two-dimensional lattice set in the photomask 61. The strip-shaped region where the light-transmissive regions T1 and T2 are formed aligns in the arrangement direction of the light-transmissive regions T1. The light-transmissive regions T1 are located on the center line of the strip-shaped region. The arrangement number of the light-transmissive regions T1 and T2 in the width direction (i.e., a direction W1) is five in a column including the light-transmissive regions T1 and six in a column formed only by the light-transmissive regions T2. In addition, two columns, which are formed only by the light-transmissive regions T2, are provided between two columns including the light-transmissive regions T1. As illustrated in FIG. 13C and FIG. 14, according to this example, the contacts shown in FIG. 13A can be formed stably.

Next, Comparative Example 1 will be described.

Figure 15A:
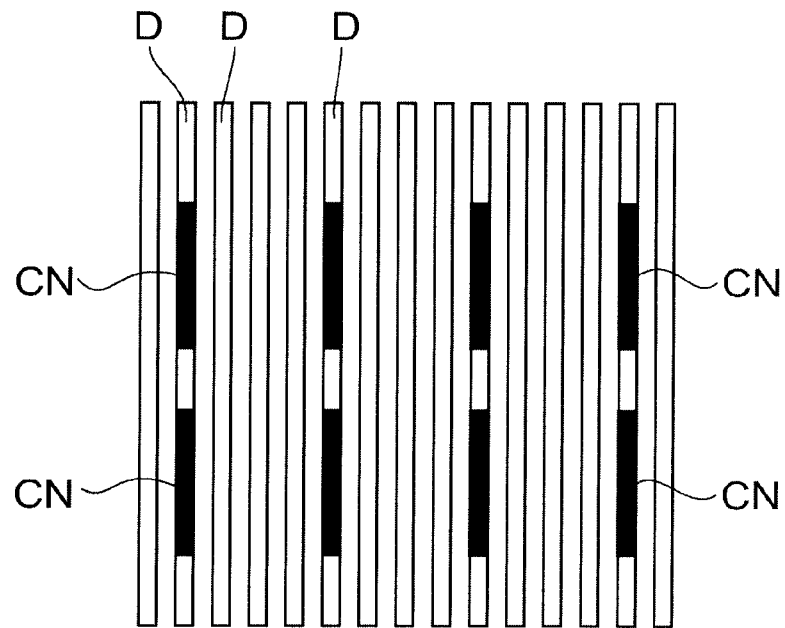
FIG. 15A is a diagram showing positions where contacts are to be formed in Comparative Example 1.
Figure 15B:
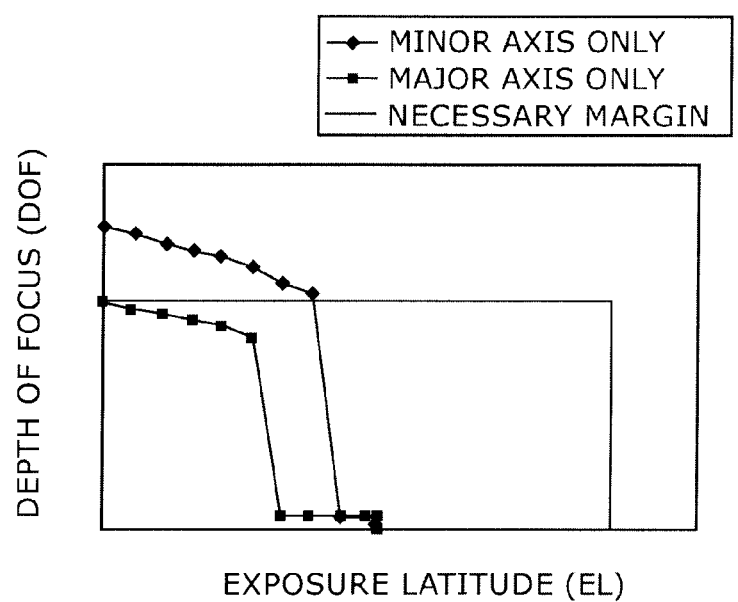
FIG. 15B is a graph showing an exposure margin of Comparative Example 1, where the horizontal axis represents the exposure latitude and the vertical axis represents the depth of focus.

FIG. 15A is a diagram showing positions where contacts are to be formed in Comparative Example 1, and FIG. 15B is a graph showing an exposure margin of Comparative Example 1, where the horizontal axis represents the exposure latitude (EL) and the vertical axis represents the depth of focus (DOF).

As illustrated in FIG. 15A, a case is assumed in Comparative Example 1 where two contacts are connected to every four conductive members, respectively. In addition, each of the contacts has a rectangular shape. The longitudinal direction of the rectangular shape coincides with the direction in which each active area extends, and the width of the rectangular shape is equal to the width of each active area. Accordingly, unlike the aforementioned embodiment of the invention, the shape does not correspond to the lattice points of the two-dimensional lattice. On the other hand, light-transmissive regions T1 having a shape corresponding to the contacts are formed in the photomask used for forming such contacts. Accordingly, in this photomask, the light-transmissive regions T1 are formed also at positions separated from the lattice points. As a result, diffracted light cannot be evenly distributed in the pupil of a lens so that it is difficult to secure a necessary exposure margin. In addition, no diffracted light with high directivity can be obtained. As a result of the simulation shown in FIG. 15B, a necessary margin could not be secured in this exposure. In other words, the contacts shown in FIG. 15A could not be formed stably in this comparative example.

Next, Comparative Example 2 will be described.

Figure 16A:
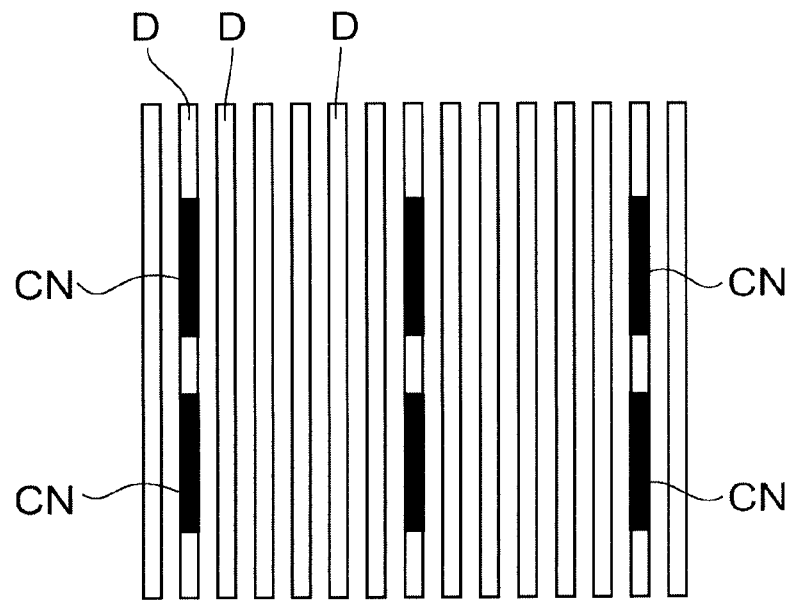
FIG. 16A is a diagram showing positions where contacts are to be formed in Comparative Example 2.
Figure 16B:
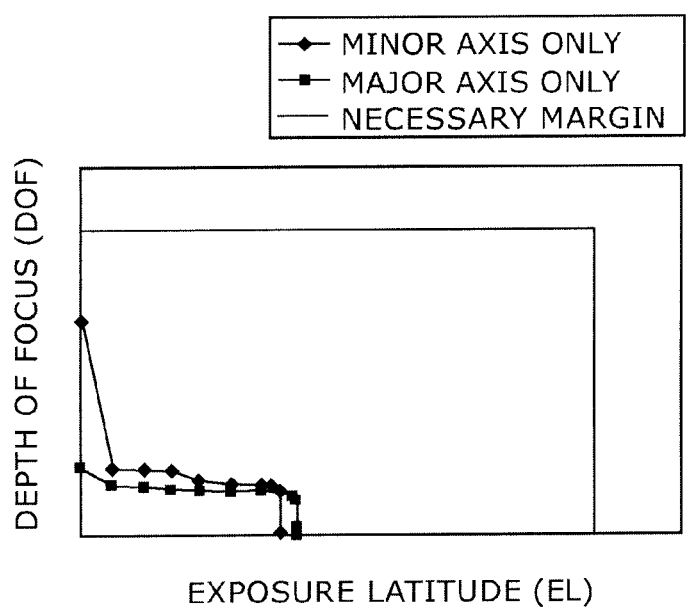
FIG. 16B is a graph showing an exposure margin of Comparative Example 2, where the horizontal axis represents the exposure latitude and the vertical axis represents the depth of focus.

FIG. 16A is a diagram showing positions where contacts are to be formed in Comparative Example 2, and FIG. 16B is a graph showing an exposure margin of Comparative Example 2, where the horizontal axis represents the exposure latitude (EL) and the vertical axis represents the depth of focus (DOF).

As illustrated in FIG. 16A, a case is assumed in Comparative Example 2 where two contacts are connected to every six conductive members, respectively. In addition, similarly to Comparative Example 1 described above, the shape of each of the contacts does not correspond to the lattice points of the two-dimensional lattice. Accordingly, the light-transmissive regions T1 are formed also at positions separated from the lattice points. Consequently, the diffracted light has low directivity. As a result of the simulation shown in FIG. 16B, a necessary margin could not be secured in this exposure. In other words, the contacts shown in FIG. 16A could not be formed stably in this comparative example.

Next, a second embodiment of the invention will be described.

A semiconductor device according to this embodiment is also a NAND flash memory.

As compared to the first embodiment described above, this embodiment is different in that multiple imaginary lattices are set in a single NAND flash memory.

Figure 17:
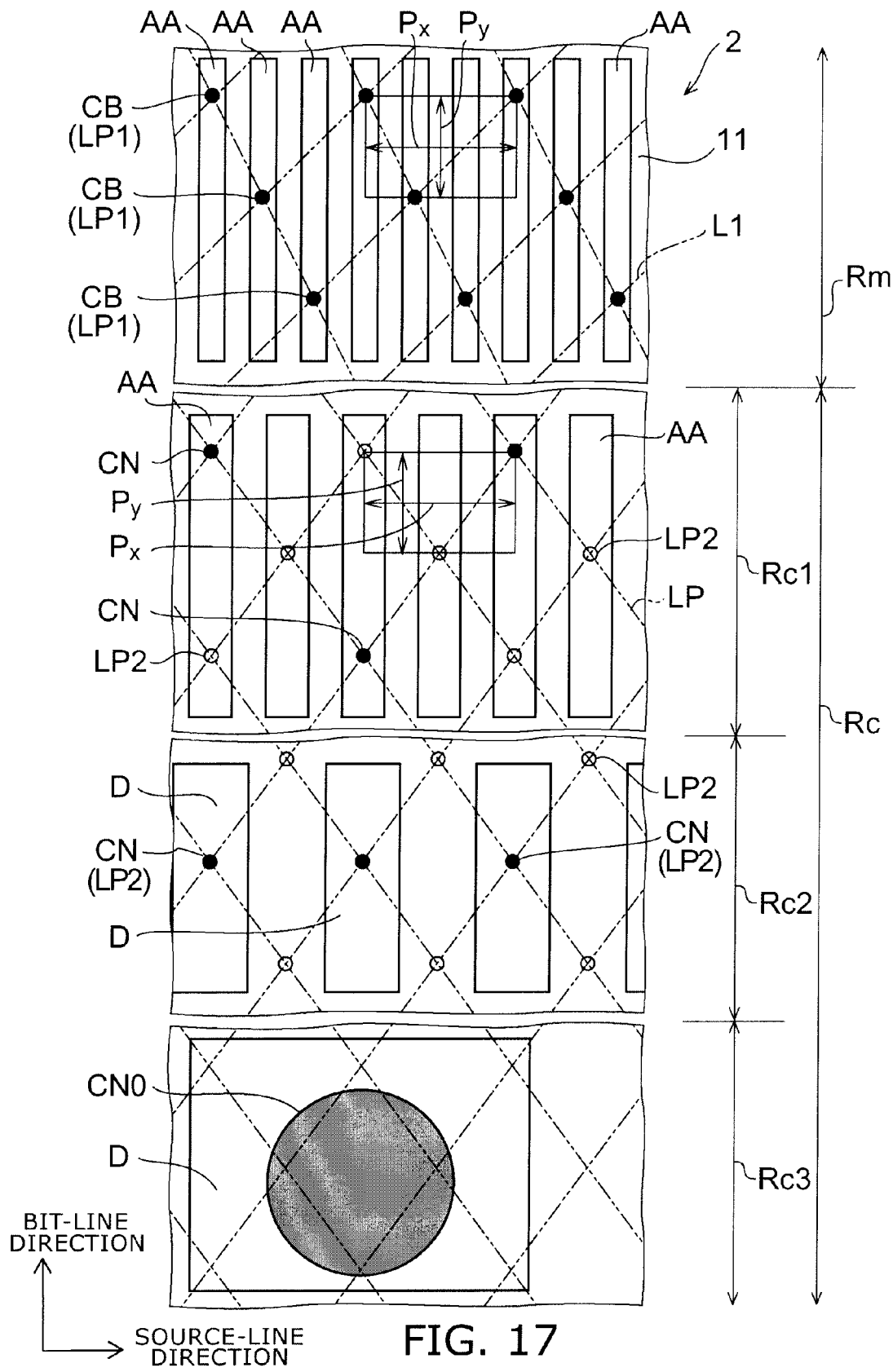
FIG. 17 is a plan view illustrating the arrangement of contacts in a semiconductor device according to a second embodiment.

FIG. 17 is a plan view illustrating the arrangement of contacts in the semiconductor device according to this embodiment.

As illustrated in FIG. 17, in a NAND flash memory 2 according to this embodiment as well, similarly to the first embodiment, a memory-array region Rm and a peripheral-circuit region Rc are defined in the NAND flash memory 2. The memory-array region Rm is a region where memory transistors are provided. Of all the regions in the NAND flash memory 2, the memory-array region Rm is the region with the finest arrangement pitch for the conductive members such as wirings and diffusion regions and is the region where the contacts are provided most densely. On the other hand, the peripheral-circuit region Rc is divided into several regions. For example, the peripheral-circuit region Rc is divided into regions Rc1 to Rc3. The region Rc1 is called the "core portion." In the region Rc1, the arrangement pitch for the conductive members is as fine as the corresponding pitch in the memory-array region Rm. Contacts are not provided in the Region Rc1 as densely as in the memory-array region Rm. For example, a row decoder, a sense amplifier, and a hook amplifier are formed in the region Rc1. Each of the regions Rc2 and Rc3 has a larger arrangement pitch for the conductive members than the memory-array region Rm and the region Rc1. In addition, in each of the regions Rc2 and Rc3, the contacts are provided more sparsely than in the memory-array region Rm and in the region Rc1.

In the memory-array region Rm, bit-line contacts CB are located at some of the lattice points LP1 of an imaginary, two-dimensional lattice L1. In FIG. 17, similarly to FIG. 1, the black circles (●) represent the lattice points with contacts and the white circles (○) represent the lattice points without contacts. In addition, in the memory-array region Rm, the positions of the bit-line contacts CB in the bit-line direction are displaced periodically based on every three consecutively-arranged active areas AA. Hereinafter, such an arrangement state of the contacts is referred to as "triple zigzag." In addition, when the positions of the bit-line contacts CB in the bit-line direction are displaced periodically based on every n consecutively-arranged active areas AA, such an arrangement state is referred to as "n-fold zigzag." Here, n is a natural number.

On the other hand, in the regions Rc1 and Rc2 of the peripheral-circuit region Rc, contacts are located at some of the lattice points LP2 of an imaginary, two-dimensional lattice L2. The two-dimensional lattice L2 differs from the two-dimensional lattice L1 of the memory-array region Rm in at least one of the directions, pitches, and phases. If contacts are formed at all the lattice points of the two-dimensional lattice L2, the positions of the contacts in the bit-line direction are displaced periodically based on every two consecutively-arranged active areas AA. In other words, the two-dimensional lattice L2 can make the arrangement state of contacts in "double zigzag." Note that, the contacts may not always be located on the active areas AA. The contacts may be located also on the extension regions formed by extending the active areas AA in the bit-line direction. Hereinafter, "n-fold zigzag" is used also for the arrangement of a lattice such that the positions of the lattice points in a direction, which conductive members with the smallest arrangement pitch align, periodically are displaced based on n consecutively-arranged conductive members or their extension regions used.

When the arrangement pitch of the lattice points in the source-line direction is $P_x$; the arrangement pitch of the lattice points in the bit-line direction is $P_y$; the numerical aperture of the projection lens in the exposure optical system is NA; the wavelength of light to be used for exposure is $\lambda$; and the normalized coordinate of the light source is $(\sigma_x, \sigma_y)$, the arrangement pitches $P_x$ and $P_y$ of the contacts satisfy the following numerical expressions 1 and 2. Here, n is n of the aforementioned "n-fold zigzag." In other words, n represents the number of the active areas AA corresponding to a basic unit used for the displacement of the positions of the contacts in the bit-line direction. In the numerical expression 1, n is not smaller than 2. The elicitation processes of the following numerical expressions 1 and 2 will be described later.

$$P_x = \frac{nP_y\left\{\sqrt{(NAnP_y\sigma_x)^2 + (n-1)\lambda^2} - NAnP_y\sigma_x\right\}}{(n-1)\lambda}$$ [Numerical Expression 1]

$$P_y = \frac{\lambda}{2NA\sigma_y}$$ [Numerical Expression 2]

Since the arrangement state of the contacts in the memory-array region Rm is "triple zigzag," n=3. Accordingly, the arrangement pitch $P_x$ of the contacts in the memory-array region Rm satisfies the following numerical expression 3.

$$P_x = \frac{3P_y\left\{\sqrt{(3NAP_y\sigma_x)^2 + 2\lambda^2} - 3NAP_y\sigma_x\right\}}{2\lambda}$$ [Numerical Expression 3]

Likewise, since the arrangement state of the contacts in each of the regions Rc1 and Rc2 of the peripheral-circuit region Rc is "double zigzag," n=2. Accordingly, the arrangement pitch $P_x$ of the contacts in the peripheral-circuit region Rc satisfies the following numerical expression 4.

$$P_x = \frac{2P_y\left\{\sqrt{(2NAP_y\sigma_x)^2 + \lambda^2} - 2NAP_y\sigma_x\right\}}{\lambda}$$ [Numerical Expression 4]

On the other hand, in the region Rc3 of the peripheral-circuit region Rc, non-bit-line contacts CN0 are formed regardless of the lattice points of the lattice L2. The diameter of each of the non-bit-line contacts CN0 is larger than the diameter of each of the contacts formed at the lattice points, that is, larger than the diameter of a bit-line contact CB and the diameter of a non-bit-line contact CN. For example, each of the non-bit-line contact CN0 is formed so as to include multiple lattice points. The arrangement of the non-bit-line contacts CN0 does not follow the numerical expressions 1 and 2 given above. The rest of the configuration of this embodiment is the same as that of the aforementioned first embodiment.

Next, a method of manufacturing the NAND flash memory 2 according to this embodiment will be described.

As compared to the aforementioned first embodiment, the manufacturing method according to this embodiment is different in the exposure method for forming contact holes. The other processes are the same as that of the first embodiment. Accordingly, the exposure method of this embodiment will be described in detail below.

Figure 18:
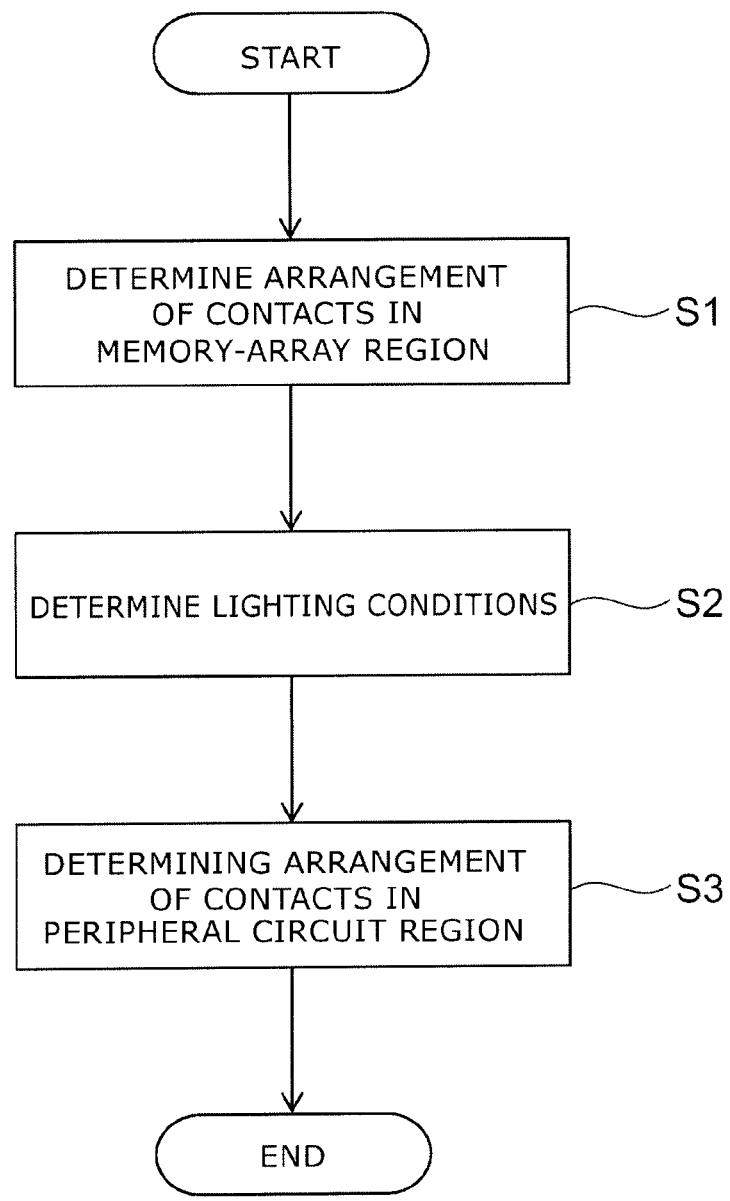
FIG. 18 is a flowchart illustrating how to determine the arrangement of the contacts in a NAND flash memory according to the second embodiment.

FIG. 18 is a flowchart illustrating how to determine the arrangement of the contacts in the NAND flash memory according to this embodiment.

Figure 19:
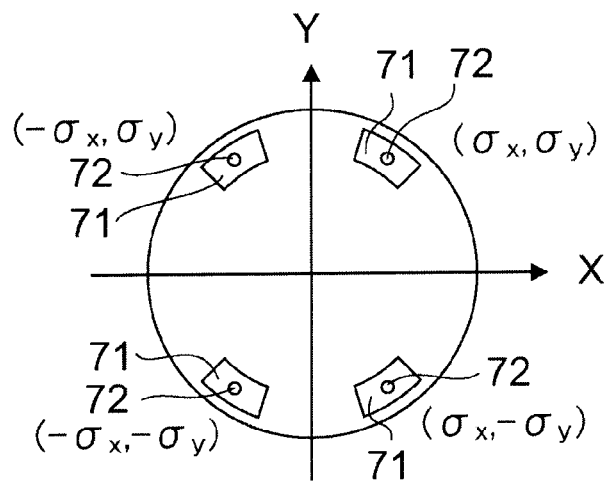
FIG. 19 is a diagram illustrating lighting conditions of the second embodiment.

FIG. 19 is a diagram illustrating lighting conditions in this embodiment.

Figure 20:
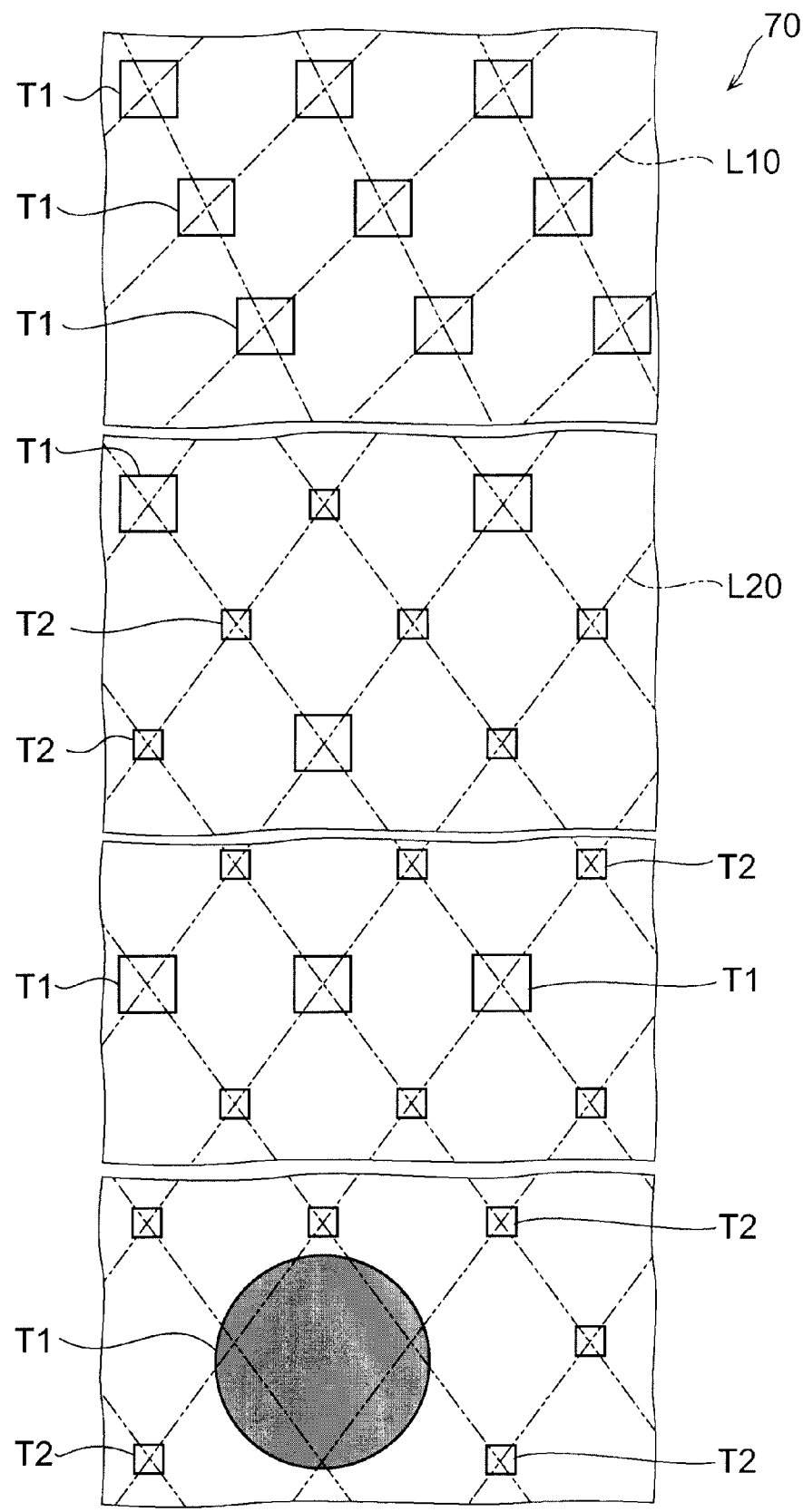
FIG. 20 is a plan view illustrating a photomask used in the second embodiment.

FIG. 20 is a plan view illustrating a photomask used in this embodiment.

The arrangement of the contacts in this embodiment is determined in accordance roughly with the following sequence of processes (1) to (3).

(1) Determining the arrangement of the contacts in the memory-array region (step S1 in FIG. 18).

(2) Determining the lighting conditions so as to form the contacts in the process (1) possible (step S2, and Numerical Expressions 5 and 6).

(3) Determining the arrangement of the contacts in the peripheral circuit region on the basis of the lighting conditions determined in the process (2) (step S3, and Numerical Expressions 1 and 2).

The processes (1) to (3) will be described in detail below.

Firstly, as illustrated in step S1 of FIG. 18, the arrangement of the contacts in the memory-array region Rm is determined. Note that, of the regions included in the NAND flash memory 2, the memory-array region Rm is the region where the conductive members and the contacts are arranged most densely. In the memory-array region Rm, the arrangement pitch of the active areas AA is set as small as possible. Nevertheless, the arrangement pitch thus set must be large enough to secure the electrical independence among the active areas AA. Subsequently, the arrangement of the bit-line contacts CB is determined so that the shortest distance between two bit-line contacts CB can be at least equal to a certain value and so that the area of the arrangement region of the bit-line contacts CB can be as small as possible.

Specifically, if the arrangement pitch of the active areas AA has already been determined, a distance in the source-line direction between two bit-line contacts CB connected respectively to active areas AA adjacent to each other is automatically determined. Accordingly, the arrangement pitch $P_y$ to make the shortest distance, in an oblique direction, between two bit-line contacts CB at least equal to a certain value is calculated uniquely. Alternatively, the minimum arrangement pitch $P_y$ that is capable of securing a large enough exposure margin is calculated by repetitive calculations of lithography simulation. Subsequently, the value of n is determined so that the area of the arrangement region of the bit-line contacts CB can be as small as possible. At this time, with a larger value of n, the arrangement pitch $P_x$ can have a larger value, but the length of the arrangement region of the bit-line contacts CB in the bit-line direction $\{(n-1) \times P_y\}$ also increases. Accordingly, when the value of n is determined, the smallest value, for example, is selected from all the possible values of n that make the value of the arrangement pitch $P_x$ at least equal to the shortest distance, in the oblique direction, between two bit-line contacts CB. In this embodiment, n=3. Thereby, the two-dimensional lattice L1 is determined.

Subsequently, as illustrated in step S2 of FIG. 18, the lighting conditions for the exposure are determined on the basis of the arrangement of the contacts determined in step S1. The lighting conditions are determined so that a favorable exposure conditions can be obtained with any value of n in the aforementioned n-fold zigzag. Specifically, a quadrupole lighting apparatus with four light-emitting regions 71 as illustrated in FIG. 19 is used. XY Cartesian coordinates are set as the coordinates corresponding to the source-line direction and the bit-line direction. When a circle corresponding to the outer edge of the pupil of the projection lens is expressed by an equation $x^2+y^2=1$, the position and the shape of each of the light-emitting regions 71 are symmetrical with respect to both the X-axis and the Y-axis. The light-emitting regions 71 include, respectively, bright spots 72 with coordinates of $(\sigma_x, \sigma_y)$, $(-\sigma_x, \sigma_y)$, $(\sigma_x, \sigma_y)$, and $(-\sigma_x, -\sigma_y)$. For example, each of the bright spots 72 is located, either exactly or approximately, at the center of the corresponding one of the light-emitting regions 71. The values of the coordinates $\sigma_x$ and $\sigma_y$ can be calculated by the following Numerical Expressions 5 and 6 with the values of n, $P_x$, and $P_y$ determined in step S1 described above. Note that, Numerical Expressions 1 and 2 are obtained by solving the equations of the Numerical Expressions 5 and 6 for $P_x$ and $P_y$. The reasons why the quadrupole lighting apparatus is used as the lighting apparatus and the elicitation processes of Numerical Expressions 5 and 6 will be described later. Subsequently, on the basis of the coordinates of the bright spots 72 and of the results of an optical simulation, the shapes of the light-emitting regions 71 are determined.

$$\sigma_x = \frac{\lambda}{2NA}\left(\frac{1}{P_x} - \frac{n-1}{n^2}\frac{P_x}{P_y^2}\right) \quad \text{[Numerical Expression 5]}$$

$$\sigma_y = \frac{\lambda}{2P_y NA} \quad \text{[Numerical Expression 6]}$$

Subsequently, as illustrated in step S3 of FIG. 18, the arrangement of the contacts in the peripheral-circuit region Rc is determined. The contacts in the peripheral-circuit region Rc are arranged so that the exposure can be performed under the lighting conditions shown in FIG. 19 and so that the positions of the contacts can fit appropriately the layout of the conductive members in each region. Specifically, the value of n is determined in accordance with the arrangement density of the conductive members in the peripheral-circuit region Rc. The value of n for the peripheral-circuit region Rc may be the same as or may be different from the value of n for the memory-array region Rm. In this embodiment, n=2 for the peripheral-circuit region Rc. The arrangement pitches $P_x$ and $P_y$ in the peripheral-circuit region Rc are determined by assigning the value of n, and the values of $\sigma_x$ and $\sigma_y$ obtained by Numerical Expressions 5 and 6 to Numerical Expressions 1 and 2 given above. Thereby, a two-dimensional lattice L2 is determined. At this time, the phase of the two-dimensional lattice L2 is selected arbitrarily so as to fit appropriately the layout of the conductive members formed in the peripheral-circuit region Rc. Then, the lattice points where non-bit-line contacts CN are to be formed are selected from all the lattice points included in the two-dimensional lattice L2 in the regions Rc1 and Rc2. On the other hand, regardless the lattice points of the two-dimensional lattice L2, any regions in the region Rc3 of the peripheral-circuit region Rc are determined arbitrarily as the regions where the non-bit-line contacts CN0 are to be formed. In this way, the arrangement of the contacts is determined in the peripheral-circuit region Rc.

As illustrated in FIG. 20, in a photomask 70 used in this embodiment, two-dimensional lattices L10 and L20 corresponding to the imaginary two-dimensional lattices L1 and L2 set in the NAND flash memory 2 are set, and a light-transmissive region T1 or T2 is formed at each lattice point of the two-dimensional lattices L10 and L20. Similarly to the aforementioned first embodiment, the light-transmissive regions T1 correspond to the positions where contacts are to be formed and the light-transmissive regions T2 correspond to the regions where no contacts are to be formed. When exposure is performed using such a photomask 70, the following contact holes can be formed with a single exposure. Contact holes for filling bit-line contacts CB at some of the lattice points of the two-dimensional lattice L1 in the memory-array region Rm can be formed; contact holes for filing non-bit-line contacts CN at some of the lattice points of the two-dimensional lattice L2 in the regions Rc1 and Rc2 of the peripheral-circuit region Rc can be formed; and contact holes for filing non-bit-line contacts CN0 at any positions in the region Rc3 can be formed. The rest of the manufacturing methods in this embodiment are the same as that of the aforementioned first embodiment.

Next, effects of this embodiment will be described.

Of the effects of this embodiment, the different point from the first embodiment is that two or more kinds of imaginary two-dimensional lattices can be set in the NAND flash memory 2. Thereby, mutually different two-dimensional lattices can be set respectively in the memory-array region Rm and the peripheral-circuit region Rc, and mutually different arrangements of the contacts can be realized. As a result, for example, in the memory-array region Rm where the arrangement density of the contacts is relatively high, a lattice aligned in the bit-line direction can be set by making the value of n relatively large. Thereby, the arrangement pitch $P_x$ of the contacts is secured at greater than or equal to certain value. On the other hand, in the peripheral-circuit region Rc where the arrangement density of the contacts is relatively low, a two-dimensional lattice compressed in the bit-line direction can be set by making the value of n relatively small to selectively form contacts at some lattice points of the two-dimensional lattice. Thereby, the area of the regions where the contacts are formed is reduced. In other words, the lattice itself can be a dense lattice compressed in the bit-line direction to thin out the lattice points for forming contacts in the peripheral-circuit region Rc. According to this embodiment as described above, while the shortest distance between contacts can be secured in the memory-array region Rm, the formation regions of contacts can be reduced in the peripheral-circuit region Rc.

Next, the elicitation processes of the aforementioned numerical expressions and the reasons why the quadrupole lighting apparatus is used as the lighting apparatus will be described.

Figure 21A:
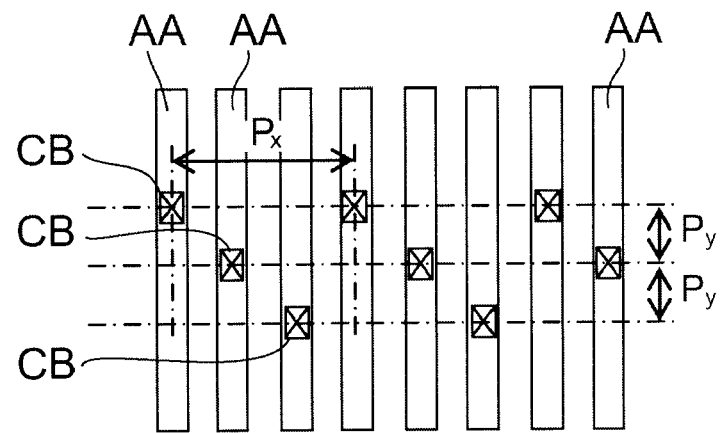
FIGS. 21A to 21C are schematic plan views illustrating the arrangement states of contacts, where
Figure 21B:
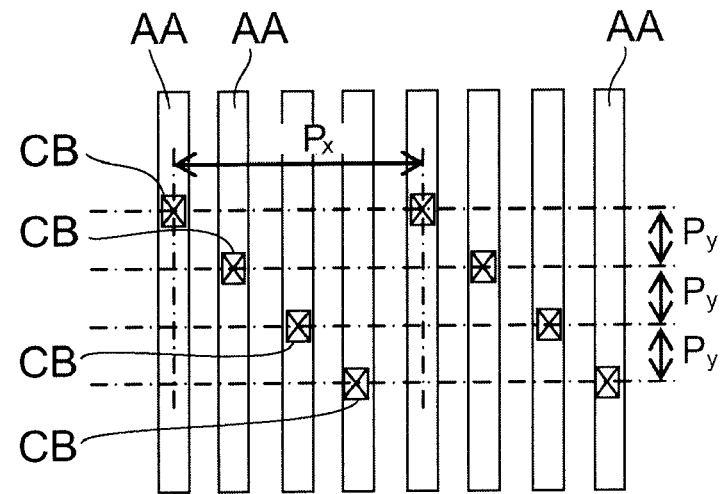
Figure 21C:
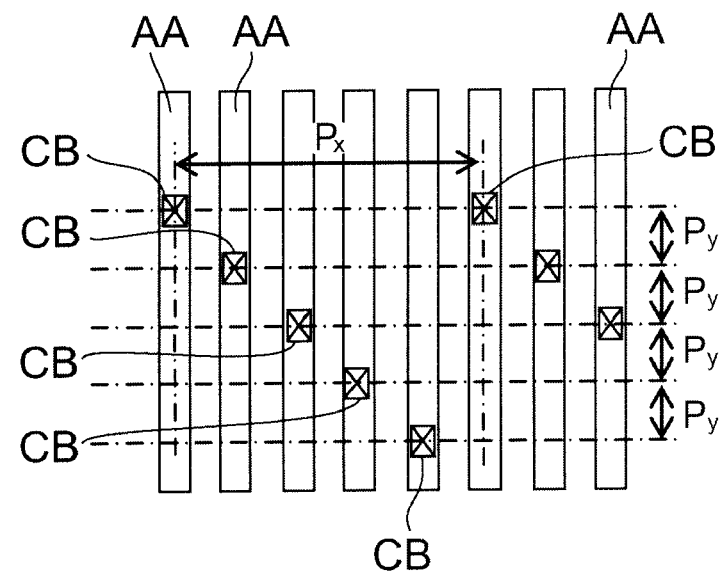

FIGS. 21A to 21C are schematic plan views illustrating the arrangement states of the contacts. FIG. 21A shows triple zigzag, FIG. 21B shows fourfold zigzag, and FIG. 21C shows fivefold zigzag.

Figure 22A:
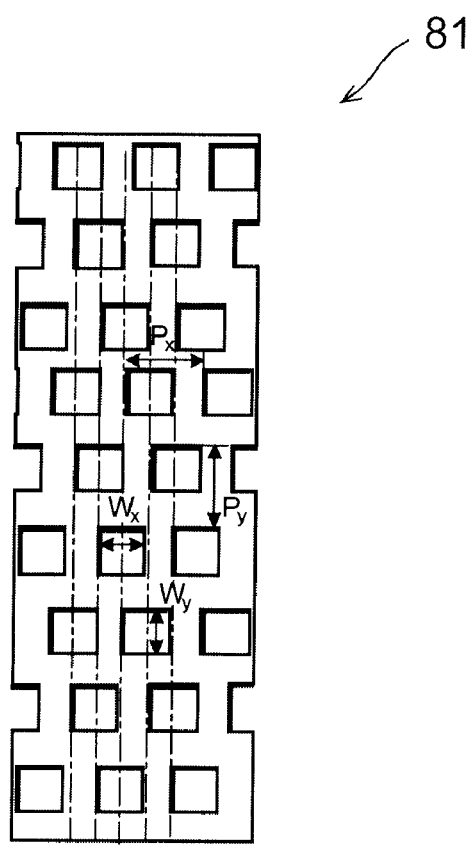
FIGS. 22A and 22B are schematic plan views illustrating a photomask for forming contacts arranged in a perfectly periodic manner in the arrangement state of n-fold zigzag, where
Figure 22B:
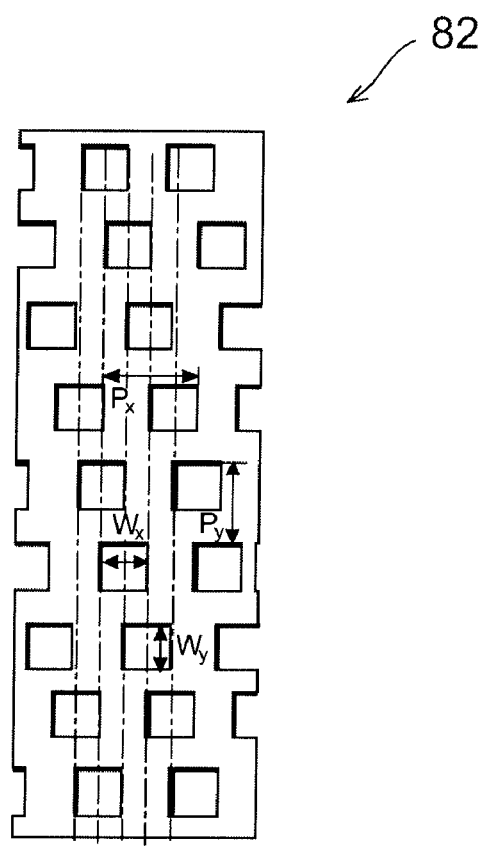

FIGS. 22A and 22B are schematic plan views illustrating a photomask for forming the contacts arranged in a perfectly periodic manner in the arrangement state of n-fold zigzag. FIG. 22A shows triple zigzag, and FIG. 22B shows fourfold zigzag.

Figure 23A:
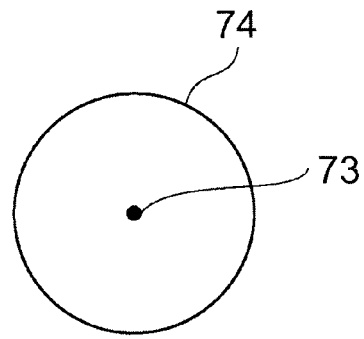
FIG. 23A is a diagram illustrating a lighting condition.
Figure 23B:
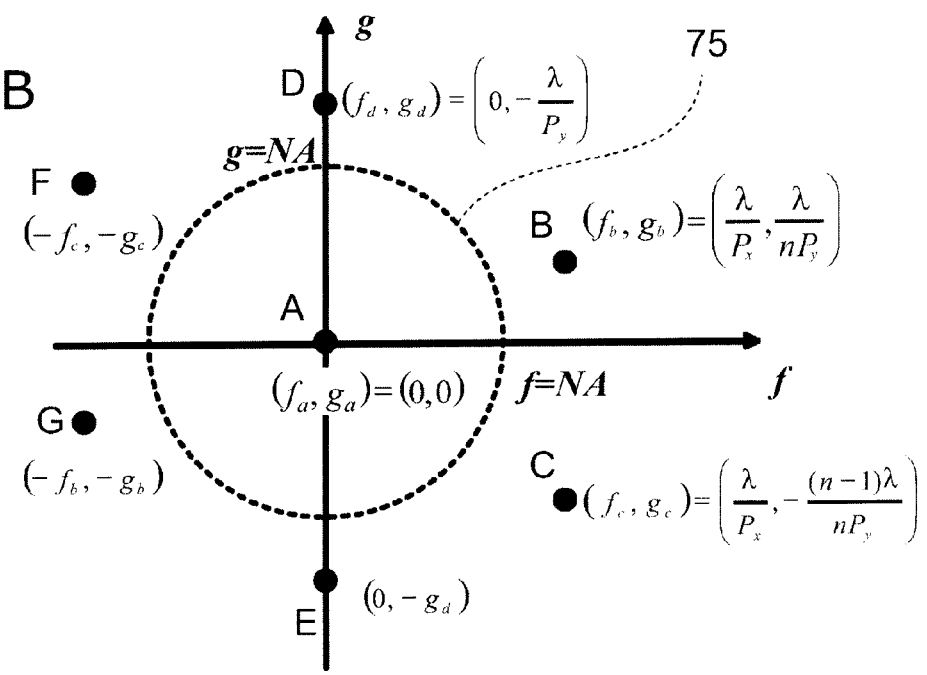
FIG. 23B is a diagram illustrating the distribution of diffracted light to be formed when the light shown in FIG. 23A is cast onto a photomask having n-fold zigzag.

FIG. 23A is a diagram illustrating a lighting condition, and FIG. 23B is a diagram illustrating the distribution of diffracted light to be formed when the light shown in FIG. 23A is cast onto a photomask having n-fold zigzag.

Figure 24A:
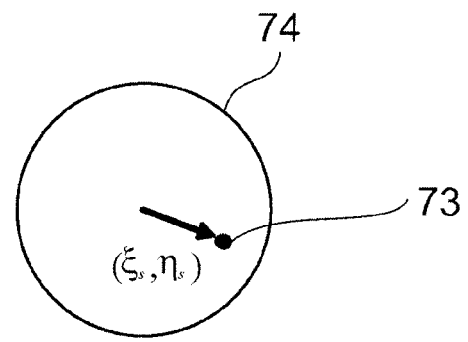
FIG. 24A is a diagram illustrating another lighting condition.
Figure 24B:
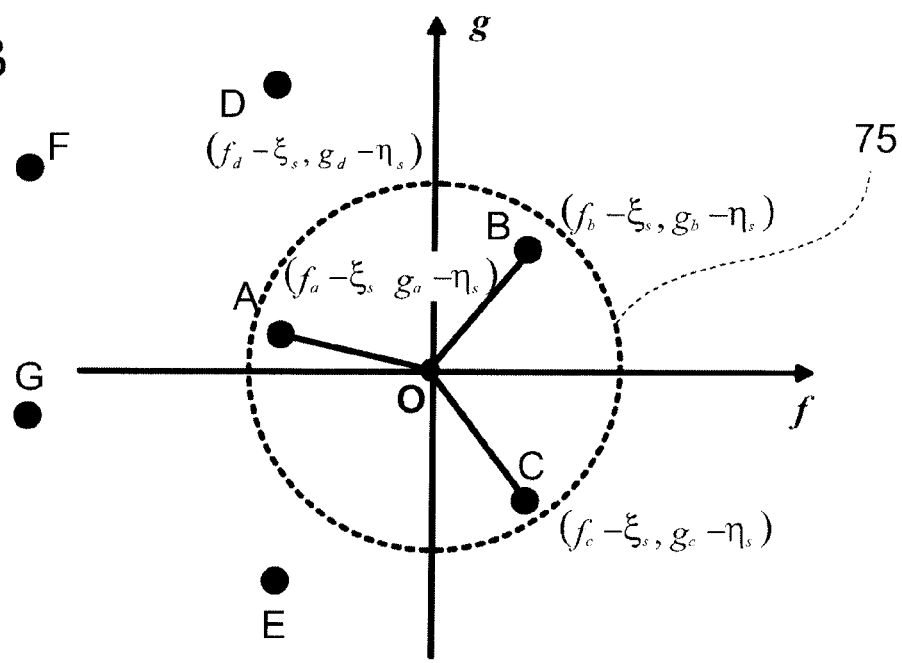
FIG. 24B is a diagram illustrating the distribution of diffracted light to be formed when the light shown in FIG. 24A is cast onto a photomask having n-fold zigzag.

FIG. 24A is a diagram illustrating another lighting condition, and FIG. 24B is a diagram illustrating the distribution of diffracted light to be formed when the light shown in FIG. 24A is cast onto a photomask having n-fold zigzag.

Figure 25:
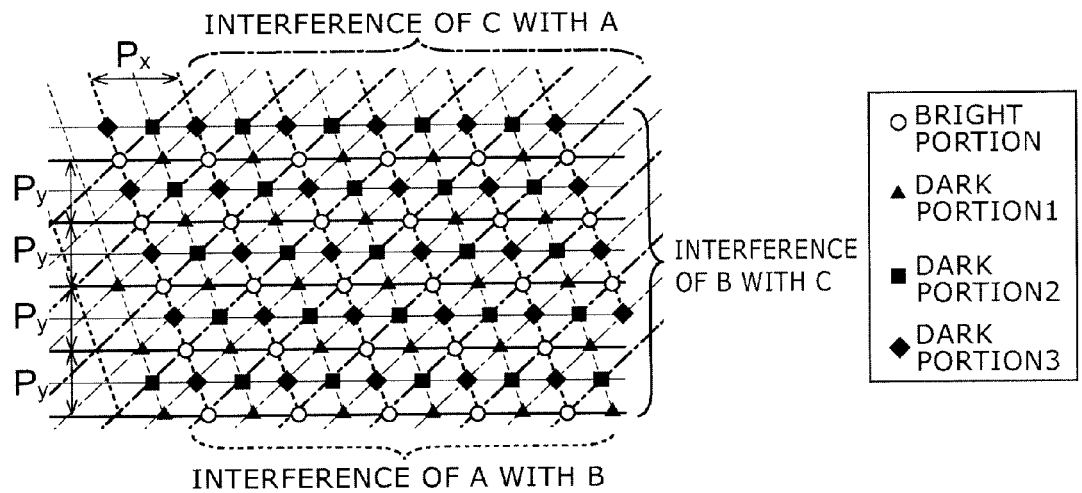
FIG. 25 is a diagram illustrating a state where three diffracted lights interfere with one another.

FIG. 25 is a diagram illustrating a state where three diffracted lights interfere with one another.

Figure 26:
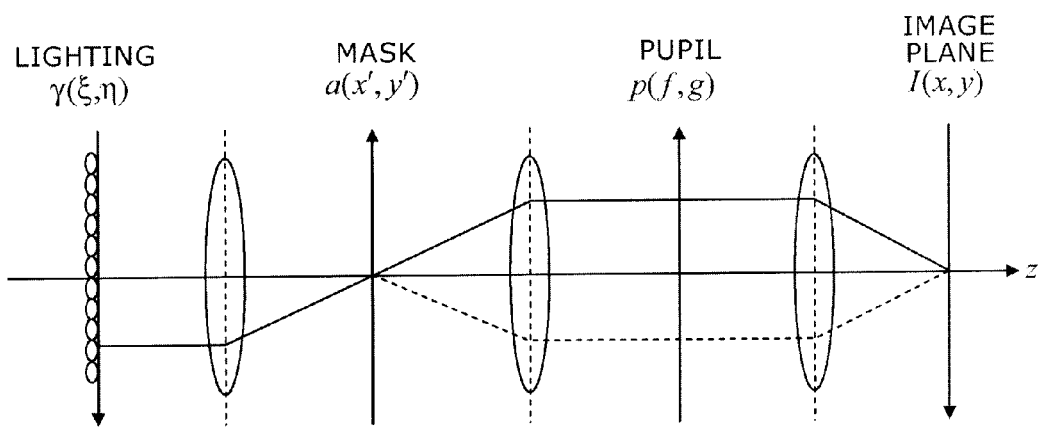
FIG. 26 is a diagram illustrating a lithography optical system.

FIG. 26 is a diagram illustrating a lithography optical system.

Figure 27A:
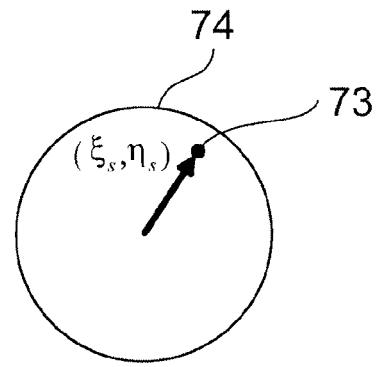
FIG. 27A is a diagram illustrating still another lighting condition.
Figure 27B:
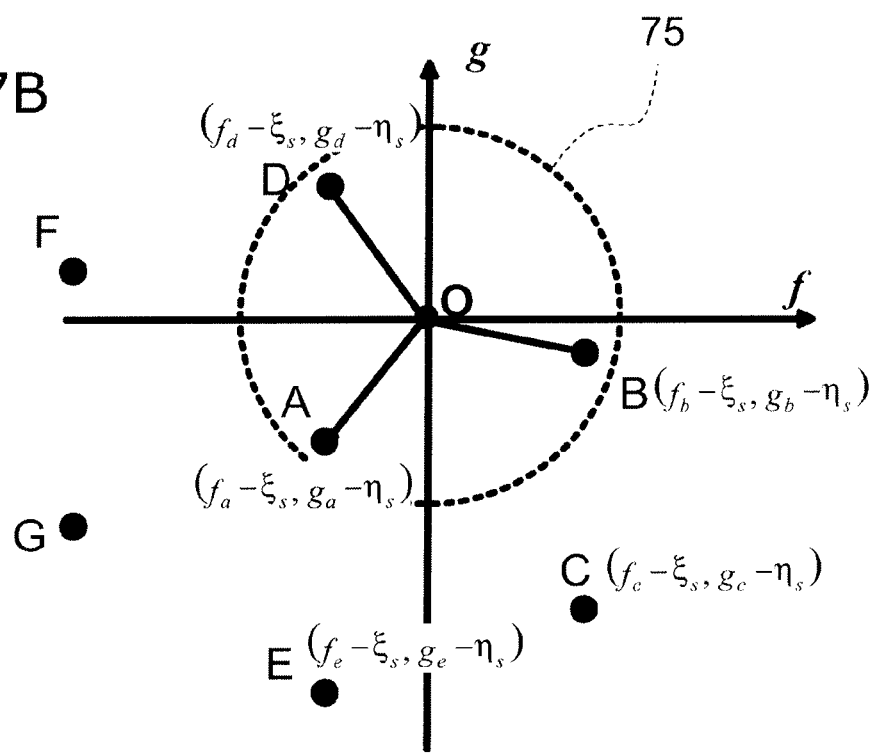
FIG. 27B is a diagram illustrating the distribution of diffracted light to be formed when the light shown in FIG. 27A is cast onto a photomask having n-fold zigzag.

FIG. 27A is a diagram illustrating still another lighting condition, and FIG. 27B is a diagram illustrating the distribution of diffracted light to be formed when the light shown in FIG. 27A is cast onto a photomask having n-fold zigzag.

Figure 28A:
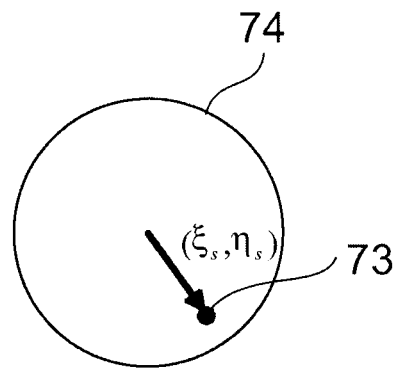
FIG. 28A is a diagram illustrating still another lighting condition.
Figure 28B:
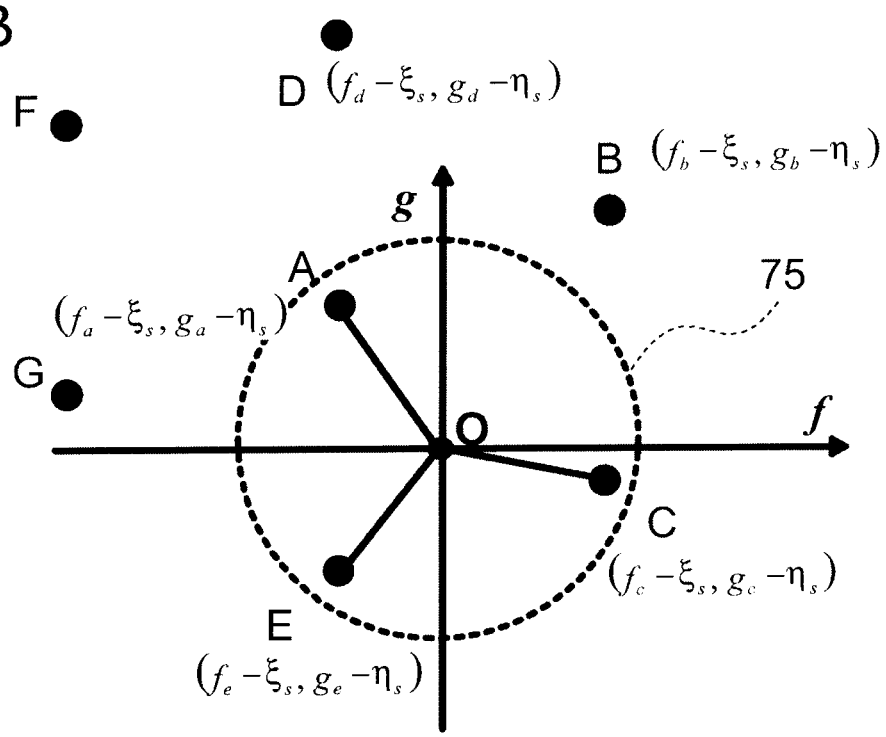
FIG. 28B is a diagram illustrating the distribution of diffracted light to be formed when the light shown in FIG. 28A is cast onto a photomask having n-fold zigzag.

FIG. 28A is a diagram illustrating still another lighting condition, and FIG. 28B is a diagram illustrating the distribution of diffracted light to be formed when the light shown in FIG. 28A is cast onto a photomask having n-fold zigzag.

As described above, in the memory-array region of the NAND flash memory, the arrangement pitch of the active areas AA is set as small as possible to improve the integration degree of memory transistors. For this reason, to make the shortest distance between bit-line contacts at greater than or equal to certain value, the arrangement of the bit-line contacts is needed to be the n-fold arrangement (n is two or greater). FIGS. 21A to 21C illustrates the arrangement states of the contacts in accordance with triple zigzag, fourfold zigzag, and fivefold zigzag, respectively.

Next, suppose a case where the contacts are arranged two-dimensionally in a perfectly periodical manner, that is, the contacts are formed respectively at all the lattice points, in the arrangement states of n-fold zigzag as illustrated in FIGS. 21A to 21C. The configurations of photomasks for forming such contacts are illustrated in FIGS. 22A and 22B.

When light is irradiated from a direction directly above as illustrated in FIG. 23 to photomasks 81 and 82 having n-fold zigzag as illustrated in FIGS. 22A and 22B, seven diffracted lights are generated as illustrated in FIG. 23B. FIG. 23B illustrates a frequency space. The distribution of the diffracted lights shown in FIG. 23B can be obtained by Fourier-transforming the graphics shown in FIGS. 22A and 22B.

As illustrated in FIG. 23A, a bright spot 73 of the light is located on the central axis of a projection lens 74. In this case, the light emitted from the bright spot 73 enters the photomask 81 or 82 along the optical axis of the projection lens 74. A diffracted light A shown in FIG. 23B is light that advances straight in the photomask, i.e., the 0th-degree diffracted light, and diffracted lights B to G are first-degree diffracted lights. A dashed-lined circle 75 illustrates the angular range that allows the entry into the pupil of the projection lens 74. Light diffracted to the outside of the circle 75 is blocked and does not reach on the substrate (silicon substrate 11). Accordingly, in the state shown in FIG. 23B, only the 0th-degree diffracted light A reaches the substrate. Thus, no interference of light occurs, and no image is formed.

Accordingly, as illustrated in FIG. 24A, the bright spot 73 is shifted from the central axis of the projection lens 74 to make the diffracted lights enter the photomask in oblique directions. Consequently, as illustrated in FIG. 24B, three diffracted lights A, B, and C enter are within the circle 75. The diffracted lights A, B, and C thus enter the pupil of the projection lens and reach on the substrate. At this time, the shift direction and the shift amount of the bright spot 73 are selected so that the positions of the diffracted lights A, B, and C are equally distant as viewed from the optical axis of the projection lens. As a result, as illustrated in FIG. 25, interference occurs on the imaging plane; bright portions are formed at positions where the waves strengthen one another; and dark portions are formed at positions where the waves weaken one another.

Next, the state of interference is quantitatively examined.

Here, a lithography optical system shown in FIG. 26 is assumed. Image formation in the lithography is expressed by the following Numerical Expression 7, which is called as the light-source surface-integral expression imaging formula. Numerical Expression 7 is obtained by substituting the expression (2.23) into the expression (2.32) described in Masato Shibuya and Hiroshi Oki, Kaisetu to Ketsuzou no Kogaku (Optics of Diffraction and Image Formation), Optics Library Series 1, Asakura Shoten, Nov. 25, 2005, pp. 40 to 47.

as the defocus aberration. In other words, Numerical Expression 9 represents the effect obtained by the shifting of the coordinate z from the origin on the image plane, that is, from the position of the focal point. Note that, aberrations other than the defocus aberration are not taken into account and that the optical system is assumed to be ideal with 100% pupil transmittance within the pupil.

The following Numerical Expression 11 is obtained by substituting Numerical Expressions 8 to 10 into Numerical Expression 7. If the defocus aberration is appropriately taken into consideration with the pupil function p(f, g), the intensity distribution I of the image plane indicated in Numerical Expression 7 becomes a function of x, y, and z. Note that, x and y are coordinates in two directions parallel with the image plane, and z is a coordinate in a direction perpendicular to the image plane.

$$I(x, y, z) \approx \left| \int\int_{f^2+g^2<NA^2} \tilde{a}(f+\xi_s, g+\eta_s) e^{-ik\{xf+yg+z\sqrt{1-f^2-g^2}\}} df dg \right|^2$$

[Numerical Expression 11]

However, the coefficient C is omitted, and the variables S, o, G, ξ, and η are replaced, respectively, with the variables γ, a, p, f, and g.

$$I(x,y) = \iint \gamma(\xi,\eta) |\iint \tilde{a}(f+\xi,g+\eta)p(f,g)e^{-ik(xf+yg)} df dg|^2 d\xi d\eta$$

[Numerical Expression 7]

Here, $k=2\pi/\lambda$, and $\lambda$ is the wavelength of the light source. In addition, as illustrated in FIG. 26, $\gamma(\xi, \eta)$ is a function representing the luminance distribution of the light; a(x', y') is a function of the amplitude transmittance of the mask and the phase distribution after Fourier transformation, that is, a function representing the diffraction image of the mask; p(f, g) is a pupil function; and I(x, y) is a function representing the intensity distribution of the image plane. Note that, Numerical Expression 7 given above is based on the scalar theory. Since light is electromagnetic waves and should be normally treated as vectors, the imaging formula based on the scalar theory is only an approximate expression.

In addition, to facilitate the development of the formula, the function $\gamma(\xi, \eta)$ representing the luminance distribution of the lighting is defined by the following Numerical Expression 8. In addition, the pupil function p(f, g) is defined by the following Numerical Expressions 9 and 10. However, NA is the numerical apertures of the lens.

$$\gamma(\xi, \eta) = \delta(\xi - \xi_s, \eta - \eta_s)$$

[Numerical Expression 8]

$$p(f, g) = e^{-iz\sqrt{1-f^2-g^2}}, (|f^2 + g^2| \leq NA^2)$$

[Numerical Expression 9]

$$p(f, g) = 0, (|f^2 + g^2| > NA^2)$$

[Numerical Expression 10]

Numerical Expression 8 given above indicates that the lighting is a point light source shifted from the optical axis by an amount ($\xi_s$, $\eta_s$). In other words, as illustrated in FIG. 24A, the lighting is formed by the bright spot 73 that has a shift amount of ($\xi_s$, $\eta_s$) to the central axis of the projection lens 74.

In addition, Numerical Expressions 9 and 10 given above indicate that, as illustrated in FIG. 24B, the light outside of the pupil ($|f^2+g^2|>NA^2$) is blocked and the light inside of the pupil ($|f^2+g^2| \leq NA^2$) is added with a phase difference known Hereinafter, specializing in an n-consecutive zigzag pattern, Numerical Expression 11 given above will be developed to derive an imaging formula. The diffraction image of the mask coincides with a diffraction image obtained on the pupil surface by irradiating the mask with a lighting apparatus having a point light source on the optical axis as illustrated in FIG. 23A. As described above, the dashed-lined circle 75 shown in FIG. 23B represents the edge of the pupil of the projection lens 74. The light outside of the pupil is blocked and does not reach on the substrate. Accordingly, in the states shown in FIGS. 23A and 23B, only the 0th-degree diffracted light can reach the substrate. For this reason, no interference of light occurs, and no image is formed. On the other hand, FIG. 24A is the distribution of diffracted light obtained when the lighting apparatus is shifted to irradiate the mask with oblique incident light. In this case, three diffracted lights enter the pupil and reach on the substrate as illustrated in FIG. 24B. FIG. 25 shows how the three diffracted light interfere with one another on the image plane. Bright portions are formed at positions where waves strengthen one another, and dark portions are formed at positions where waves weaken one another. In view of the Fourier transformation of the mask with the shift amount of the lighting ($\xi_s$, $\eta_s$), the distribution of diffracted lights on the pupil surface at that time is expressed by the following Numerical Expression 12

$$\tilde{a}(f+\xi_s, g+\eta_s) =$$

$$A\delta\{f - (f_a - \xi_s), g - (g_a - \eta_s)\} +$$

$$B\delta\{f - (f_b - \xi_s), g - (g_b - \eta_s)\} +$$

$$C\delta\{f - (f_c - \xi_s), g - (g_c - \eta_s)\}$$

[Numerical Expression 12]

By substituting Numerical Expression 12 into Numerical Expression 11 and then developing the definite-integral portion, the following Numerical Expression 13 is obtained.

By assigning the coordinates shown in FIGS. 23B and 24B to Numerical Expressions 14 and 15 given above, and then solving the equations for n-fold zigzag, the following Numerical Expressions 16 and 17 are obtained.

$$I(x, y, z) \approx$$ [Numerical Expression 13]
$$A^2 + B^2 + C^2 + 2AB\cos\left[k(f_a - f_b)x + k(g_a - g_b)y + k\left\{\sqrt{1-(f_a-\xi_s)^2-(g_a-\eta_s)^2} - \sqrt{1-(f_b-\xi_s)^2-(g_b-\eta_s)^2}\right\}z\right] +$$
$$2BC\cos\left[k(f_b - f_c)x + k(g_b - g_c)y + k\left\{\sqrt{1-(f_b-\xi_s)^2-(g_b-\eta_s)^2} - \sqrt{1-(f_c-\xi_s)^2-(g_c-\eta_s)^2}\right\}z\right] +$$
$$2CA\cos\left[k(f_c - f_a)x + k(g_c - g_a)y + k\left\{\sqrt{1-(f_c-\xi_s)^2-(g_c-\eta_s)^2} - \sqrt{1-(f_a-\xi_s)^2-(g_a-\eta_s)^2}\right\}z\right]$$

In Numerical Expression 13 given above, the first to the third terms on the right-hand side represent uniform components that are dependent on none of the coordinates x, y, and z. The fourth to the sixth terms represent interference waves generated by the interference of the diffracted light A with the diffracted light B, the interference of the diffracted light B with the diffracted light C, and the interference of the diffracted light C and the diffracted light A, respectively. The three diffracted light A, B, and C form three planar waves and form bright portions and dark portions. For example, if the resist film 50 (see FIG. 6C and FIG. 7) is a positive resist, exposure can be performed in a favorable state by allocating the regions where contact holes are to be formed in the positions to be the bright portions. The exposed portions are removed by the development, and a resist mask is formed. Contact holes are formed by etching the interlayer insulating film by use of the resist mask thus formed.

Here, the lighting conditions that maximize the depth of focus are defined as the optimal lighting conditions. In this case, the optimal lighting conditions are achieved when the coefficient of z in Numerical Expression 13 is zero. Specifically, conditions that satisfy the following Numerical Expressions 14 and 15 are the optimal lighting conditions.

$$(f_a-\xi_s)^2+(g_a-\eta_s)^2=(f_b-\xi_s)^2+(g_b-\eta_s)^2 \quad \text{[Numerical Expression 14]}$$

$$(f_b-\xi_s)^2+(g_b-\eta_s)^2=(f_c-\xi_s)^2+(g_c-\eta_s)^2 \quad \text{[Numerical Expression 15]}$$

$$\xi_s = \frac{\lambda}{2}\left(\frac{1}{P_x} + \frac{n-1}{n^2}\frac{P_x}{P_y^2}\right) \quad \text{[Numerical Expression 16]}$$

-continued $$\eta_s = -\frac{(n-2)\lambda}{2nP_y} \quad \text{[Numerical Expression 17]}$$

When the shift amount of the bright spot 73 ($\xi_s$, $\eta_s$) satisfies Numerical Expressions 16 and 17 given above, Numerical Expression 13 is transformed to the following Numerical Expression 18. In this case, the optical image is given by Numerical Expression 18. Thereby, exposure that has a larger depth of focus and is less likely to be affected by the defocusing can be performed because the z component is eliminated.

$$I(x, y, z) \approx A^2 + B^2 + C^2 + 2AB\cos\left(\frac{2\pi}{P_x}x + \frac{2\pi}{nP_y}y\right) + 2BC\cos\left(\frac{2\pi}{P_y}y\right) + 2CA\cos\left(\frac{2\pi}{P_x}x - \frac{2\pi(n-1)}{nP_y}y\right) \quad \text{[Numerical Expression 18]}$$

The coordinate system of the lighting is expressed ordinarily by normalizing with the numerical aperture NA. Accordingly, the optimal lighting conditions are expressed by the coordinates ($\sigma_x$, $\sigma_y$) obtained by normalizing, with the numerical aperture NA, the shift amount ($\xi_s$, $\eta_s$) given by the Numerical Expressions 16 and 17. The coordinates ($\sigma_x$, $\sigma_y$) thus normalized are provided by the following Numerical Expressions 19 and 20. These are the theoretical formulas of the optimal lighting conditions to maximize the depth of focus.

$$\sigma_x = \frac{\lambda}{2NA}\left(\frac{1}{P_x} + \frac{n-1}{n^2}\frac{P_x}{P_y^2}\right) \quad \text{[Numerical Expression 19]}$$

$$\sigma_y = \frac{(n-2)\lambda}{2nNAP_y} \quad \text{[Numerical Expression 20]}$$

The above description is based on the case where the diffracted lights A, B, and C shown in FIG. 24B are applied in the bright spot positions of the lighting as illustrated in FIG. 24A.

On the other hand, also in the case where the diffracted lights A, B, and D shown in FIGS. 27A and 27B are applied and the case where the diffracted lights A, C, and E shown in FIGS. 28A and 28B are applied, similar discussions described above are possible. The coordinates ($\sigma_x$, $\sigma_y$) of the bright spot in a case shown in FIGS. 27A and 27B are given by the following Numerical Expressions 21 and 22, which are the same formulas as Numerical Expressions 5 and 6. In addition, the coordinates ($\sigma_x$, $\sigma_y$) of the bright spot in a case shown in FIGS. 28A and 28B are given by the following Numerical Expressions 23 and 24.

Consequently, an optical image is obtained with a larger depth of focus.

Figure 29:
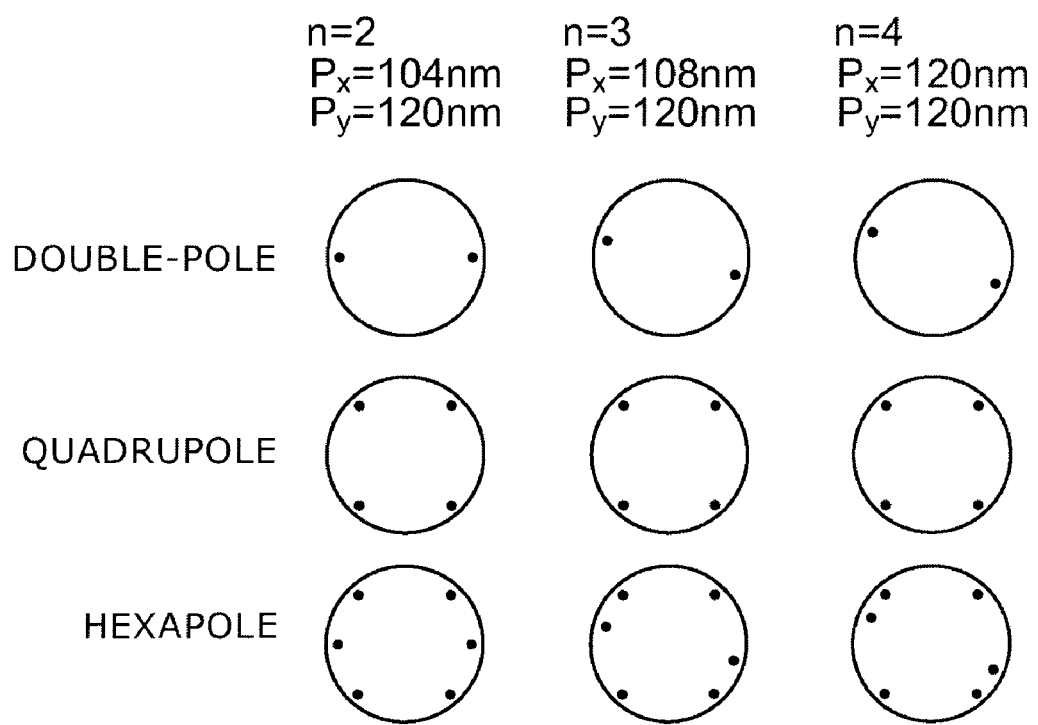
FIG. 29 is a diagram showing an example of lighting conditions including the coordinates ($\sigma_x$, $\sigma_y$) of bright spots.

The following description will focus on the cases of quadrupole lighting apparatus. As illustrated in FIG. 29, the bright spots are located at approximately the same positions in any case of n=2, 3, or 4. In addition, according to the investigation by the inventors, in the quadrupole lighting apparatus, the bright spots are located at approximately the same positions even if n is 5 or greater. Further, in the cases where the contacts are located at the lattice points of an orthogonal lattice, that is, in a case of n=1, the bright spots are $$\sigma_x = \frac{\lambda}{2NA}\left(\frac{1}{P_x} - \frac{n-1}{n^2}\frac{P_x}{P_y^2}\right)$$ [Numerical Expression 21]

$$\sigma_y = \frac{\lambda}{2NAP_y}$$ [Numerical Expression 22]

$$\sigma_x = \frac{\lambda}{2NA}\left(\frac{1}{P_x} - \frac{n-1}{n^2}\frac{P_x}{P_y^2}\right)$$ [Numerical Expression 23]

$$\sigma_y = -\frac{\lambda}{2NAP_y}$$ [Numerical Expression 24]

Even in the case where there is only one bright spot as illustrated in FIG. 24A, FIG. 27A, and FIG. 28A, the aforementioned optimal lighting conditions can be achieved. However, in the case where contact holes are formed without using the bright portions generated by the interference like the non-bit-line contacts CN0 shown in FIG. 17, the shapes of the contact holes become asymmetrical if the lighting condition with respect to the optical axis of the imaging lens is asymmetrical. In addition, if there is only a single bright spot, energy concentrates on a single point in the optical system. That is undesirable. Accordingly, in the actual lighting apparatus, bright spots are preferably provided respectively at located at approximately the same positions. Accordingly, if the lighting for exposure is provided by a quadrupole lighting apparatus, multiple n-fold zigzags having different values of n (n is natural numbers) can be achieved simultaneously. If, however, n-fold zigzag with an arbitrarily determined value of n is achieved by relying on the lighting conditions, the arrangement pitches $P_x$ and $P_y$ of the contacts are limited by the lighting conditions. For example, in the case where n-fold zigzag is achieved by the lighting conditions shown in FIG. 27, the arrangement pitches $P_x$ and $P_y$ of the contacts are obtained by solving Numerical Expressions 21 and 22 for $P_x$ and $P_y$, that is, the arrangement pitches $P_x$ and $P_y$ are given by the following Numerical Expressions 25 and 26.

$$P_x = \frac{\left\{\sqrt{(NAnP_y\sigma_x)^2 + (n-1)\lambda^2} - NAnP_y\sigma_x\right\}nP_y}{(n-1)\lambda}$$ [Numerical Expression 25]

$$P_y = \frac{\lambda}{2NA\sigma_y}$$ [Numerical Expression 26]

multiple positions that are symmetrical with respect to the optical axis of the imaging lens.

FIG. 29 is a diagram illustrating an example of the lighting conditions including the coordinates ($\sigma_x$, $\sigma_y$) of the bright spots given by Numerical Expressions 19 to 24 given above.

FIG. 29 illustrates the lighting conditions of double-pole, quadrupole, and hexapole in each case where n is 2, 3, or 4. The bright spots shown in FIG. 29 are calculated with NA=1.30 and λ=193 nm. Under any lighting conditions shown in FIG. 29, interference of three lights is achieved.

Numerical Expressions 25 and 26 given above are the same as Numerical Expressions 1 and 2 given above, respectively. In addition, in the case where n-fold zigzag is achieved by the lighting conditions shown in FIGS. 28A and 28B, the arrangement pitches $P_x$ and $P_y$ of the contacts are obtained by solving Numerical Expressions 23 and 24 given above for $P_x$ and $P_y$, that is, the arrangement pitches $P_x$ and $P_y$ are given by the following Numerical Expressions 27 and 28.

$$P_x = \frac{nP_y\left\{NAnP_y\sigma_x - \sqrt{(NAnP_y\sigma_x)^2 - (n-1)\lambda^2}\right\}}{(n-1)\lambda}$$ [Numerical Expression 27]

$$P_y = \frac{\lambda}{2NA\sigma_y}$$ [Numerical Expression 28]

As described above, by selecting the arrangement pitches $P_x$ and $P_y$ of contacts in accordance with Numerical Expressions 25 and 26 or Numerical Expressions 27 and 28, the interference of three diffracted lights can be achieved and thereby an image with a larger depth of focus can be obtained. In addition, by using a quadrupole lighting apparatus as a lighting apparatus, n-fold zigzag can be achieved regardless of the value of n. Further, by using a quadrupole lighting apparatus as a lighting apparatus, the shape of the non-bit-line contact NC0 not formed at the lattice point can be a symmetrical shape with respect to the central axis.

Next, an example of pattern layout will be described below.

FIG. 30A is a diagram illustrating the lighting conditions of this example. FIGS. 30B to 30D are plan views illustrating photomasks suitable for each of the lighting conditions shown in FIG. 30A.

Figures 31A, 31B, 31C:
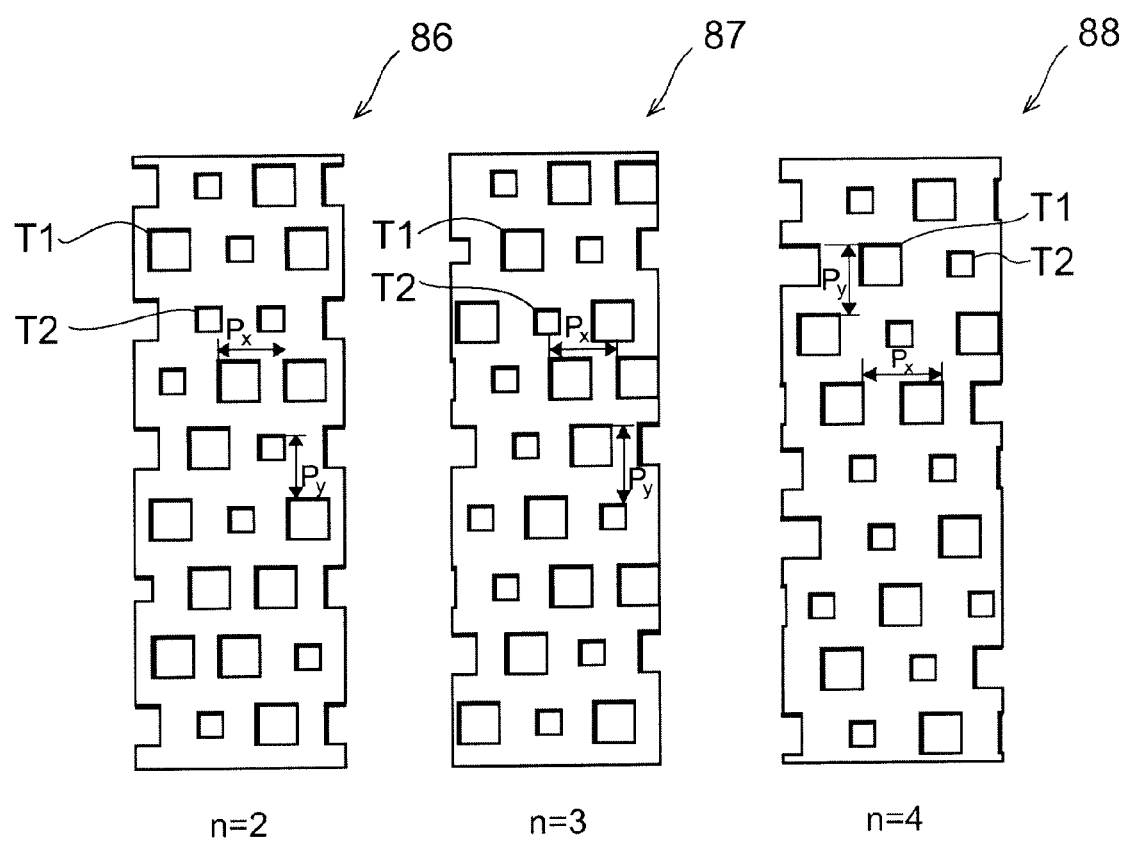
FIGS. 31A to 31C are plan views illustrating photomasks suitable for the lighting conditions shown in FIG. 30A.

FIGS. 31A to 31C are plan views illustrating photomasks suitable for each of the lighting conditions shown in FIG. 30A.

As illustrated in FIG. 30A, exposure is performed under the conditions where the numerical aperture NA=1.30 and the wavelength of the light $\lambda$=193 nm, using a quadrupole lighting apparatus of $(\sigma_x, \sigma_y)$=(0.58, 0.62). In this case, it is preferable to use photomasks 83 to 85 having patterns as illustrated in FIGS. 30B to 30D in accordance with Numerical Expressions 25 and 26. Alternatively, photomasks 86 to 88 shown in FIGS. 31A to 31C may also be used as photomasks while maintaining the layouts and the arrangement pitches $P_x$ and $P_y$. The photomasks 86 to 88 have both the light-transmissive regions T1 where a projection image is resolved and the light-transmissive regions T2 where no projection image is resolved. As described in the aforementioned first embodiment, the aforementioned light-transmissive regions T1 are the pattern for opening contact holes and the light-transmissive regions T2 are the accessory pattern for not opening contact holes.

The description given thus far is based on an assumption that each light-emitting region is a bright spot with coordinates $(\sigma_x, \sigma_y)$. In an actual exposure apparatus, it is necessary to assume that the light-emitting region is a region with a certain, limited area. In other words, the light-emitting region is a region including the aforementioned bright spot, and the bright spot is located, for example, approximately at the center of the light-emitting region. However, the coordinates $(\sigma_x, \sigma_y)$ of the bright spot are calculated by approximation formulas. Thus, when exposure is actually performed, the shape of the light-emitting region must be optimized by performing simulations repeatedly. For this reason, the bright spot does not have to be at the exact center of the light-emitting region. Accordingly, the arrangement pitches $P_x$ and $P_y$ of the lattice points may deviate from their respective values given by Numerical Expressions 1 and 2. Even in this case, however, the arrangement pitches $P_x$ and $P_y$ are still within ±50% ranges for their respective values given by Numerical Expressions 1 and 2. In addition, the lattice points are arranged periodically in accordance with the arrangement pitches $P_x$ and $P_y$.

When the NAND flash memory 2 is examined, multiple imaginary two-dimensional lattices where contacts are located at some of the lattice points can be derived from the basis of the state in which the contacts are arranged. Then, it is possible to determine the values of the arrangement pitches $P_x$ and $P_y$ for the two-dimensional lattices as well as the value of n. However, it is not possible to directly obtain the parameters of the lighting conditions, i.e., the coordinates $(\sigma_x, \sigma_y)$ of the bright spot, the wavelength $\lambda$ of the light, and the numerical aperture NA. However, the value of each of the parameters of the lighting conditions is common to all the imaginary two-dimensional lattices set in the NAND flash memory 2. Therefore, by substituting these common parameters in Numerical Expressions 1 and 2, the arrangement pitches $P_x$ and $P_y$ for all the two-dimensional lattices set in the NAND flash memory 2 can be calculated. In other words, if the values of the arrangement pitches $P_x$ and $P_y$ and the value of n in the all the two-dimensional lattices derived from a particular semiconductor device satisfy Numerical Expressions 1 and 2 having common coordinates $(\sigma_x, \sigma_y)$ of the bright spot, wavelength $\lambda$ of the light, and numerical aperture NA, the semiconductor device can be said as a device of this embodiment.

The effects of this embodiment other than the ones described above are the same as those obtained in the first embodiment.

Next, a third embodiment of the invention will be described.

Figure 32:
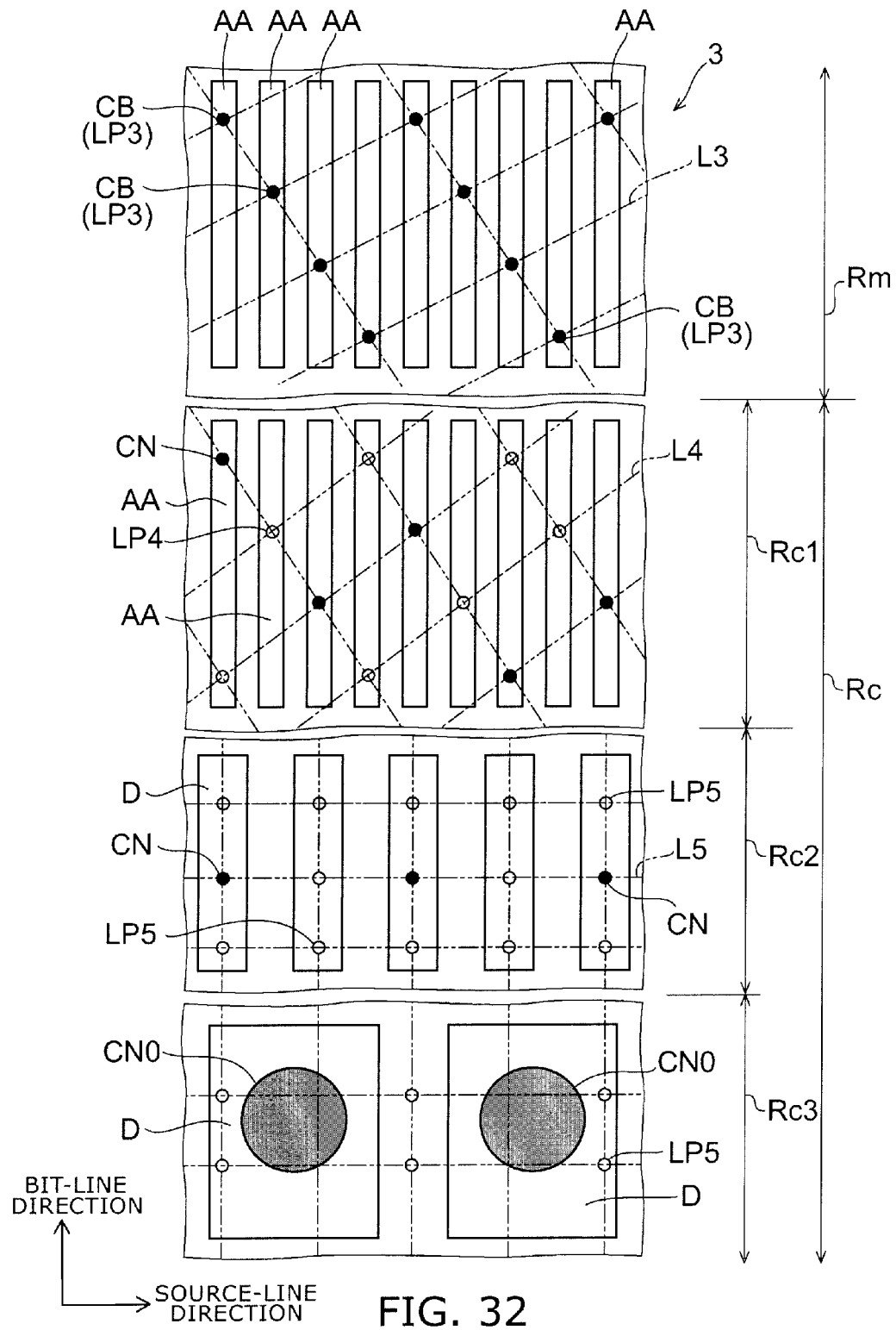
FIG. 32 is a plan view illustrating the arrangement of contacts in a semiconductor device according to a third embodiment.

FIG. 32 is a plan view illustrating the arrangement of contacts in a semiconductor device according to this embodiment.

In a NAND flash memory 3 according to this embodiment as illustrated in FIG. 32, bit-line contacts CB are located at some of lattice points LP3 of a lattice L3 having fourfold zigzag in the memory-array region Rm. In the region Rc1 of the peripheral-circuit region Rc, non-bit-line contacts CN are located at some of lattice points LP4 of a lattice L4 having triple zigzag. In addition, in the region Rc2, non-bit-line contacts CN are located at some of lattice points LP5 of an orthogonal lattice L5, that is, a lattice having single zigzag. Further, in the region Rc3, non-bit-line contacts CN0 are located regardless the lattice L5. In a case of single zigzag, the arrangement pitches $P_x$ and $P_y$ of lattice points are given by the following Numerical Expressions 29 and 30.

$$P_x = \frac{\lambda}{2NA\sigma_x}$$ [Numerical Expression 29]

$$P_y = \frac{\lambda}{2NA\sigma_y}$$ [Numerical Expression 30]

In the case where the coordinates $(\sigma_x, \sigma_y)$ of the bright spot of the lighting is calculated on the basis of the arrangement pitches $P_x$ and $P_y$ of the lattice having a single zigzag, the coordinates $(\sigma_x, \sigma_y)$ are given by the following Numerical Expressions 31 and 32, which are calculated from Numerical Expressions 29 and 30 given above.

$$\sigma_x = \frac{\lambda}{2P_x NA} \qquad \text{[Numerical Expression 31]}$$

$$\sigma_y = \frac{\lambda}{2P_y NA} \qquad \text{[Numerical Expression 32]}$$

The configuration, manufacturing method, and effects of this embodiment other than the portions thereof that have been described above are similar to those of the second embodiment.

The aforementioned second embodiment shows cases where the arrangement states of contacts are triple zigzag and double zigzag, and the third embodiment shows cases where the arrangement states of contacts are fourfold zigzag, triple zigzag, and orthogonal-lattice (single zigzag). The invention, however, is not limited thereto. In other words, the invention can be carried out with combining arbitrarily selected two or more lattices having n-fold zigzag that can be formed under a single set of lighting conditions. In addition, multiple lattices, which have n-fold zigzag with the same value of n and include lattice points having mutually different phases, may coexist.

Note that, the descriptions of the embodiments given above are based on cases where transmissive photomasks are used for exposure, but the invention is not limited thereto. Reflective photomasks may be used, and EUV (extreme ultraviolet) masks may be used as well. In addition, a semiconductor device is not limited to a NAND flash memory.

According to the embodiments described above, a semiconductor device that can form contacts densely and a method of manufacturing thereof can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A semiconductor device comprising:
   a substrate;
   conductive members provided in an upper portion of the substrate or above the substrate to extend in one direction;
   an interlayer insulating film provided on the substrate and the conductive members; and
   a plurality of contacts provided in the interlayer insulating film,
   in a first region on the substrate, the contacts being located at some of lattice points of an imaginary first lattice,
   in a second region on the substrate, the contacts being located at some of lattice points of an imaginary second lattice, the second lattice being different from the first lattice, and
   each of the first lattice and the second lattice including some of the lattice points located on the conductive members or on an extension region extended in the one direction of the conductive members, a position of each of the lattice points located on the conductive members and the extension region in the one direction being periodically displaced based on every n consecutively-arranged conductive members, n being a natural number.

2. The device according to claim 1, wherein
   the device is a NAND flash memory,
   the contacts located at the lattice points of the first lattice are bit-line contacts, and
   a value of the n for the first lattice is larger than a value of the n for the second lattice.

3. The device according to claim 1, wherein
   the substrate is a semiconductor substrate,
   the conductive members are sections of the upper portion of the semiconductor substrate, the sections being separated from each other, and
   the contacts located at the lattice points of the first lattice are connected to the conductive members.

4. The device according to claim 1, wherein
   the device is a NAND flash memory,
   the first region is a memory-array region, and
   the second region includes a core portion.

5. The device according to claim 1, wherein
   a value of the n for the first lattice is 3, and a value of the n for the second lattice is 2.

6. The device according to claim 1, wherein
   a value of the n for the first lattice is 4 or larger.

7. The device according to claim 1, further comprising another contact located in the second region and formed to include a plurality of lattice points of the second lattice.

8. The device according to claim 1, wherein
   the following equations are satisfied for the first lattice and the second lattice:

$$P_x = \frac{nP_y\left\{\sqrt{(NAnP_y\sigma_x)^2 + (n-1)\lambda^2} - NAnP_y\sigma_x\right\}}{(n-1)\lambda}, \text{ and}$$

$$P_y = \frac{\lambda}{2NA\sigma_y}$$

where $P_x$ is an arrangement pitch of the lattice points in one other direction orthogonal to the one direction, $P_y$ is an arrangement pitch of the lattice points in the one direction, NA is a numerical aperture of a projection lens of an exposure optical system, $\lambda$ is a wavelength of light used for exposure, $(\sigma_x, \sigma_y)$ are normalized coordinates of a light source, and n is an integer of 2 or larger.

9. The device according to claim 8, wherein
   the device is a NAND flash memory,
   the contacts located at the lattice points of the first lattice are bit-line contacts, and
   a value of the n for the first lattice is larger than a value of the n for the second lattice.

10. The device according to claim 8, wherein
    the substrate is a semiconductor substrate,
    the conductive members are sections of the upper portion of the semiconductor substrate, the sections being separated from each other, and
    the contacts located at the lattice points of the first lattice are connected to the conductive members.

11. The device according to claim 8, wherein
    the device is a NAND flash memory,
    the first region is a memory-array region, and
    the second region includes a core portion.

12. A semiconductor device comprising:
    a substrate;
    conductive members provided in an upper portion of the substrate or above the substrate to extend in one direction;

an interlayer insulating film provided on the substrate and the conductive members; and a plurality of contacts penetrating the interlayer insulating film, at least some of the contacts being located at some of a plurality of lattice points arranged at a first pitch along a first direction as well as at a second pitch along a second direction intersecting with the first direction, a position of each of the contacts connected to the conductive members in the one direction being periodically displaced based on every three or more consecutively-arranged conductive members, and two or more contacts of the at least some of the contacts being connected to one of the conductive members.

13. The device according to claim 12, wherein the two or more contacts connected to the one of the conductive members are bit-line contacts.

14. The device according to claim 13, wherein the first direction is a direction having the smallest arrangement pitch among arrangement directions of the bit-line contacts.

15. The device according to claim 12, wherein all of the plurality of contacts penetrating the interlayer insulating film are located at some of the plurality of lattice points.

* * * * *